US011843235B2

(12) United States Patent
Takuma et al.

(10) Patent No.: US 11,843,235 B2
(45) Date of Patent: Dec. 12, 2023

(54) OVERCURRENT PROTECTION CIRCUIT

(71) Applicant: Rohm Co., Ltd., Kyoto (JP)

(72) Inventors: Toru Takuma, Kyoto (JP); Naoki Takahashi, Kyoto (JP); Shuntaro Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/181,064

(22) Filed: Mar. 9, 2023

(65) Prior Publication Data

US 2023/0216289 A1 Jul. 6, 2023

Related U.S. Application Data

(63) Continuation of application No. 17/503,907, filed on Oct. 18, 2021, now Pat. No. 11,637,420, which is a (Continued)

(30) Foreign Application Priority Data

Apr. 28, 2016 (JP) ................... 2016-090585
Apr. 28, 2016 (JP) ................... 2016-090587

(51) Int. Cl.
  *H02M 1/00* (2006.01)
  *H02H 1/00* (2006.01)
  (Continued)

(52) U.S. Cl.
  CPC ........... *H02H 1/0007* (2013.01); *B60R 16/02* (2013.01); *B60R 16/03* (2013.01); *H02H 3/087* (2013.01);
  (Continued)

(58) Field of Classification Search
  CPC ....... H02M 1/00; H02H 1/0007; H02H 3/087; H02H 3/093; H02H 7/20; H02H 7/205; B60R 16/02; B60R 16/03
  See application file for complete search history.

(56) References Cited

U.S. PATENT DOCUMENTS 6,320,275 B1  11/2001  Okamoto et al.
6,356,423 B1   3/2002  Hastings
             (Continued)

FOREIGN PATENT DOCUMENTS

CN  103684370       3/2014
JP  H5-92824 U     12/1993
             (Continued)

OTHER PUBLICATIONS

Japan Patent Office, International Search Report for PCT/JP2017/008536, dated Apr. 18, 2017 (with English translation).

*Primary Examiner* — Adolf D Berhane
(74) *Attorney, Agent, or Firm* — Fish & Richardson P.C.

(57) ABSTRACT

In order both to accommodate instantaneous current as well as overcurrent protection in accordance with the load, an overcurrent protection circuit has: a threshold value generation unit that, in accordance with a threshold value control signal, switches between setting an overcurrent detection threshold value to a first set value ($\propto$ Iref) and a second set value ($\propto$ Iset) lower than the first set value; an overcurrent detection unit that compares a sense signal in accordance with the current being monitored and the overcurrent detection value and generates an overcurrent protection signal; a reference value generation unit that generates a reference value ($\propto$ Iset) in accordance with the seconds set value; a comparison unit that compares the sense signal and the reference value, and generates a comparison signal; and a threshold value control unit that monitors the comparison signal, and generates a threshold value control signal.

12 Claims, 28 Drawing Sheets

Related U.S. Application Data continuation of application No. 17/007,662, filed on Aug. 31, 2020, now Pat. No. 11,183,829, which is a continuation of application No. 16/088,934, filed as application No. PCT/JP2017/008536 on Mar. 3, 2017, now Pat. No. 10,790,657.

(51) Int. Cl.
| | |
|---|---|
| *H02H 3/093* | (2006.01) |
| *B60R 16/02* | (2006.01) |
| *H02H 3/087* | (2006.01) |
| *H02H 7/20* | (2006.01) |
| *B60R 16/03* | (2006.01) |

(52) U.S. Cl.
CPC .............. *H02H 3/093* (2013.01); *H02H 7/20* (2013.01); *H02H 7/205* (2013.01)

(56) References Cited

U.S. PATENT DOCUMENTS

| | | | |
|---|---|---|---|
| 10,658,831 | B2 | 5/2020 | Takuma |
| 10,790,657 | B2 | 9/2020 | Takuma et al. |
| 11,183,829 | B2 | 11/2021 | Takuma et al. |
| 11,637,420 | B2 * | 4/2023 | Takuma ............... H02H 1/0007 |
| | | | 361/87 |
| 2011/0110009 | A1 | 5/2011 | Sugimoto |
| 2013/0286515 | A1 | 10/2013 | White |
| 2014/0078629 | A1 | 3/2014 | Cortigiani et al. |
| 2020/0403393 | A1 | 12/2020 | Takuma et al. |
| 2021/0184583 | A1 | 6/2021 | Tanghe et al. |
| 2022/0037872 | A1 | 2/2022 | Takuma et al. |

FOREIGN PATENT DOCUMENTS

| | | |
|---|---|---|
| JP | 2000-023346 | 1/2000 |
| JP | 2012-211805 A | 11/2012 |
| JP | 2014-124062 A | 7/2014 |
| JP | 2015-046954 A | 3/2015 |

\* cited by examiner

OVERCURRENT PROTECTION CIRCUIT

CROSS-REFERENCE TO RELATED APPLICATIONS

This application is a continuation application of U.S. patent application Ser. No. 17/503,907, filed Oct. 18, 2021, which is a continuation application of U.S. patent application Ser. No. 17/007,662, filed Aug. 31, 2020, now U.S. Pat. No. 11,183,829, which is a continuation application of U.S. patent application Ser. No. 16/088,934, filed Sep. 27, 2018, now U.S. Pat. No. 10,790,657, which is a U.S. National Phase Application of International Application No. PCT/JP2017/008536, filed Mar. 3, 2017 which claims priority to Japanese Application No. 2016-090587, filed on Apr. 28, 2016 and Japanese Application No. 2016-090585 filed Apr. 28, 2016, contents of which are hereby incorporated by reference.

TECHNICAL FIELD

The present invention relates to an overcurrent protection circuit.

BACKGROUND ART

Conventionally, many of semiconductor integrated circuit devices are provided with an overcurrent protection circuit as one of their abnormality protection circuits. For example, an in-vehicle IPD (intelligent power device) is provided with an overcurrent protection circuit, which restricts the amount of output current flowing through a power transistor not to exceed an overcurrent set value, for the purpose of preventing the device from breaking in a case of a short-circuit in a load connected to the power transistor. In recent years, there has been proposed an overcurrent protection circuit that is capable of adjusting an overcurrent set value as necessary by using an external resistor.

Examples of conventional technologies related to the above are disclosed in Patent Document 1 and Patent Document 2 listed below.

CITATION LIST

Patent Literature

Patent Document 1: Japanese Patent Application Publication No. 2015-46954
Patent Document 2: Japanese Patent Application Publication No. 2012-211805

SUMMARY OF INVENTION

Technical Problem

However, loads connected to a power transistor include one (such as a capacitive load) that requires a large output current to instantaneously flow therethrough in its normal operation. In a case where a target to be monitored is such an output current, with conventional overcurrent protection circuits, having a single overcurrent set value, it is difficult to achieve both the securing of the instantaneous current and overcurrent protection suitable for the load.

In particular, in recent years, in-vehicle ICs are required to comply with ISO26262 (the international standard for the functional safety of electrical electronics systems in production automobiles), and as to in-vehicle IPDs, too, a higher reliability design has become important.

The invention disclosed herein has been made in view of the above-mentioned problem found by the inventors of the present invention, and an object thereof is to provide an overcurrent protection circuit capable of achieving both the securing of an instantaneous current and overcurrent protection suitable for a load.

Solution to Problem

An overcurrent protection circuit disclosed herein includes a threshold generator which switches, in accordance with a threshold control signal, whether an overcurrent detection threshold should be a first set value or a second set value which is lower than the first set value, an overcurrent detector which compares a sense signal in accordance with a monitored current with the overcurrent detection threshold and thereby generates an overcurrent protection signal, a reference value generator which generates a reference value in accordance with the second set value, a comparison section which compares the sense signal with the reference value and thereby generates a comparison signal, and a threshold controller which monitors the comparison signal and thereby generates the threshold control signal (first configuration).

In the overcurrent protection circuit having the first configuration, when the overcurrent detection threshold has been set to the first set value, the threshold controller may generate the threshold control signal such that the overcurrent detection threshold is switched to the second set value at a time point when a mask period elapses with the sense signal maintained above the reference value (second configuration).

In the overcurrent protection circuit having the second configuration, when the overcurrent detection threshold has been set to the second set value, the threshold controller may generate the threshold control signal such that the overcurrent detection threshold is switched to the first set value at a time point when the sense signal falls below the reference value (third configuration).

In the overcurrent protection circuit having the second or third configuration, the mask period may be a variable value (fourth configuration).

In the overcurrent protection circuit having any one of the first to fourth configurations, the first set value may be a fixed value, and the second set value may be a variable value (fifth configuration).

A semiconductor integrated circuit device disclosed herein includes, integrated therein, a power transistor which switches a current path, through which an output current flows, between a conducting state and a cutoff state, an output current monitor which generates a sense signal in accordance with the output current, a gate controller which generates a driving signal for the power transistor in accordance with a control signal, and the overcurrent protection circuit having any one of the first to fifth configurations which monitors the sense signal and thereby generates an overcurrent protection signal. Here, the gate controller is provided with a function of forcibly turning off the power transistor in accordance with the overcurrent protection signal (sixth configuration).

The semiconductor integrated circuit device having the sixth configuration may further include, integrated therein, a signal output section which selectively outputs, to outside the device, one of a detection result of the output current and an abnormality flag as a status notification signal (seventh configuration).

An electronic apparatus disclosed herein includes the semiconductor integrated circuit device having the sixth or seventh configuration, and a load connected to the semiconductor integrated circuit device (eighth configuration).

In the electronic apparatus having the eighth configuration, the load may be a bulb lamp, a relay coil, a solenoid, a light emitting diode, or a motor (ninth configuration).

A vehicle disclosed herein includes the electronic apparatus having the eighth or ninth configuration (tenth configuration).

An overcurrent protection circuit disclosed herein includes a first threshold generator which switches, in accordance with a first threshold control signal, whether a first overcurrent detection threshold should be a first set value or a second set value which is lower than the first set value, a second threshold generator which switches, in accordance with a second threshold control signal, whether a second overcurrent detection threshold should be a third set value or a fourth set value which is lower than the third set value, a first overcurrent detector which compares a first sense signal in accordance with a first monitored current with the first overcurrent detection threshold and thereby generates a first overcurrent protection signal, a second overcurrent detector which compares a second sense signal in accordance with a second monitored current with the second overcurrent detection threshold and thereby generates a second overcurrent protection signal, a first reference value generator which generates a first reference value in accordance with the second set value, a second reference value generator which generates a second reference value in accordance with the fourth set value, a first comparison section which compares the first sense signal with the first reference value and thereby generates a first comparison signal, a second comparison section which compares the second sense signal with the second reference value and thereby generates a second comparison signal, and a threshold controller which monitors both the first comparison signal and the second comparison signal and thereby generates the first threshold control signal and the second threshold control signal (eleventh configuration).

In the overcurrent protection circuit having the eleventh configuration, the threshold controller may include an external terminal for externally connecting a capacitor, a comparator which compares a charge voltage which appears at the external terminal with a predetermined reference voltage and thereby generates an internal signal, a first flip-flop which generates the first threshold control signal in accordance with the internal signal and the first comparison signal, a second flip-flop which generates the second threshold control signal in accordance with the internal signal and the second comparison signal, a discharge controller which performs discharge control of the capacitor in accordance with the internal signal, and a charge controller which performs charge control of the capacitor in accordance with both the first comparison signal and the second comparison signal (twelfth configuration).

In the overcurrent protection circuit having the twelfth configuration, the discharge controller may accept input of not only the internal signal but also the first comparison signal, the second comparison signal, the first threshold control signal, and the second threshold control signal, and in a case where, after a logic-level change occurs in one of the first comparison signal and the second comparison signal and a charging operation of the capacitor is started, a logic-level change occurs in an other of the first comparison signal and the second comparison signal before the charge voltage becomes higher than the reference voltage, the capacitor may be discharged (thirteenth configuration).

In the overcurrent protection circuit having the thirteenth configuration, the threshold controller may further include a first delay section which gives a delay to the first comparison signal and thereby generates a first delay signal, and a second delay section which gives a delay to the second comparison signal and thereby generates a second delay signal, and the first delay signal and the second delay signal, instead of the first comparison signal and the second comparison signal, may be inputted to the first flip-flop and the second flip-flop, respectively (fourteenth configuration).

In the overcurrent protection circuit having any one of the eleventh to fourteenth configurations, the first set value and the third set value may each be a fixed value, and the second set value and the fourth set value may each be a variable value (fifteenth configuration).

A semiconductor integrated circuit device disclosed herein includes, integrated therein, a first power transistor which switches a first current path, through which a first output current flows, between a conducting state and a cutoff state, a second power transistor which switches a second current path, through which a second output current flows, between a conducting state and a cutoff state, a first output current monitor which generates a first sense signal in accordance with the first output current, a second output current monitor which generates a second sense signal in accordance with the second output current, a first gate controller which generates a first driving signal for the first power transistor in accordance with a first control signal, a second gate controller which generates a second driving signal for the second power transistor in accordance with a second control signal, and the overcurrent protection circuit having any one of the eleventh to fifteenth configurations which monitors the first sense signal and the second sense signal and thereby generates a first overcurrent protection signal and a second overcurrent protection signal. Here, the first gate controller and the second gate controller have functions of forcibly turning off the first power transistor and the second power transistor in accordance with the first overcurrent protection signal and the second overcurrent protection signal, respectively (sixteenth configuration).

The semiconductor integrated circuit device having the sixteenth configuration may further include, integrated therein, a first signal output section which generates one of a detection result of the first output current and an abnormality flag as a first status notification signal, a second signal output section which generates one of a detection result of the second output current and an abnormality flag as a second status notification signal, and a multiplexer which selectively outputs one of the first status notification signal and the second status notification signal to outside the device (seventeenth configuration).

An electronic apparatus disclosed herein includes the semiconductor integrated circuit device having the sixteenth or seventeenth configuration, a first load connected to the first power transistor, and a second load connected to the second power transistor (eighteenth configuration).

In the electronic apparatus having the eighteenth configuration, the first load and the second load may each be a bulb lamp, a relay coil, a solenoid, a light emitting diode, or a motor (nineteenth configuration).

A vehicle disclosed herein includes the electronic apparatus having the eighteenth or nineteenth configuration (twentieth configuration).

Advantageous Effects of Invention

According to the invention disclosed herein, it is possible to provide an overcurrent protection circuit capable of achieving both the securing of an instantaneous current and overcurrent protection suitable for a load.

DESCRIPTION OF EMBODIMENTS

Semiconductor Integrated Circuit Device (First Embodiment)

Figure 1:
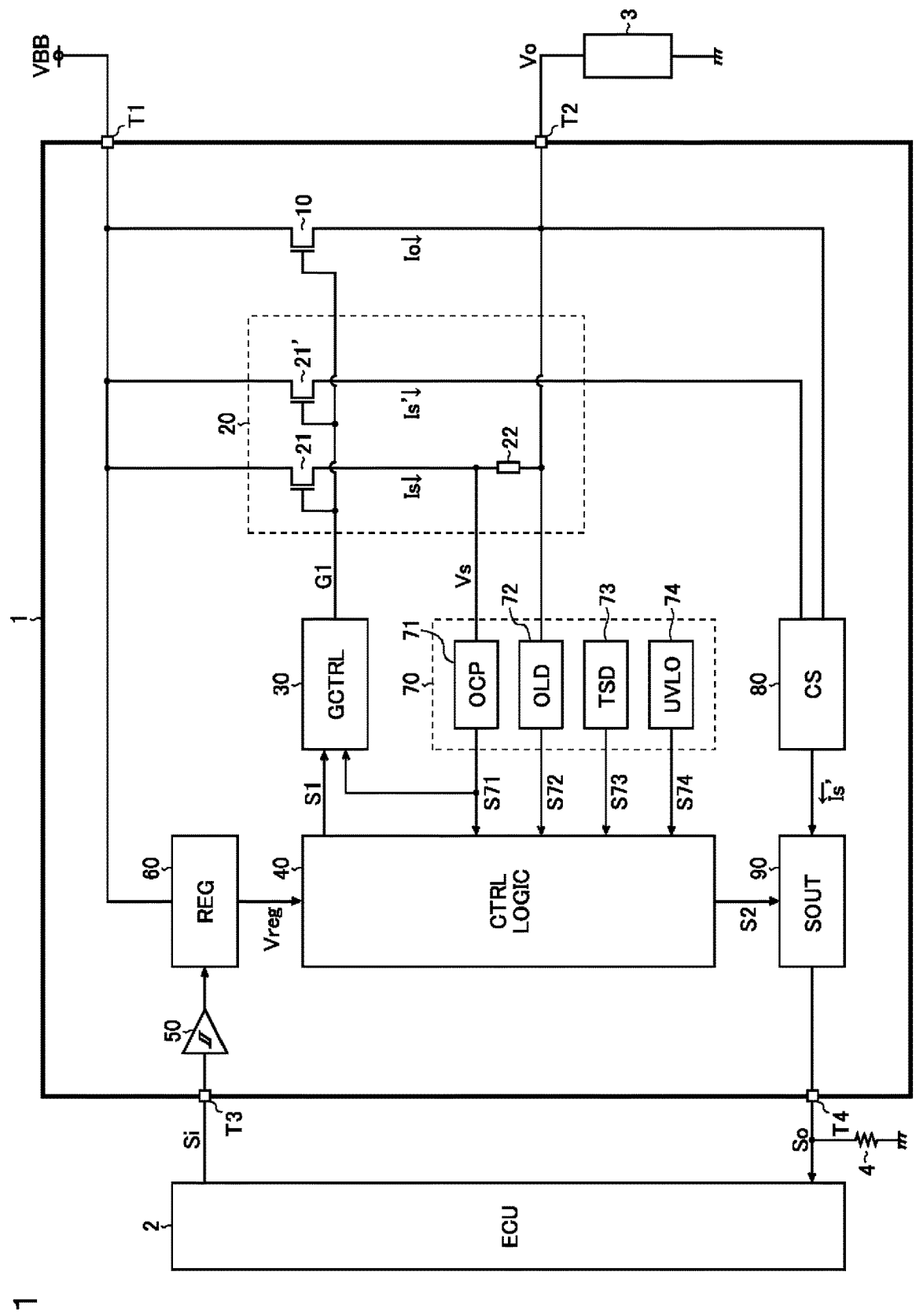
FIG. 1 is a block diagram illustrating a first embodiment of a semiconductor integrated circuit device.

FIG. 1 is a block diagram illustrating a first embodiment of a semiconductor integrated circuit device. The semiconductor integrated circuit device 1 of the present embodiment is an in-vehicle high-side switch IC (a kind of in-vehicle IPD) which achieves a conducting/cutoff state between an application terminal of a power supply voltage VBB and a load 3 in accordance with an instruction from an ECU (electronic control unit) 2.

Here, the semiconductor integrated circuit device 1 includes external terminals T1 to T4 as means for establishing electrical connection with outside the device. The external terminal T1 is a power supply terminal (a VBB pin) for receiving supply of power supply voltage VBB (12V, for example) from an unillustrated battery. The external terminal T2 is a load connection terminal (an OUT pin) for externally connecting a load 3 (such as a bulb lamp, a relay coil, a solenoid, a light emitting diode, or a motor). The external terminal T3 is a signal input terminal (an IN pin) for accepting external input of an external control signal Si from the ECU 2. The external terminal T4 is a signal output terminal (a SENSE pin) for externally outputting a status notification signal So to the ECU 2. Here, between the external terminal T4 and a ground terminal, an external sense resistor 4 is externally connected.

The semiconductor integrated circuit device 1 includes, integrated therein, an NMOSFET 10, an output current monitor 20, a gate controller 30, a control logic section 40, a signal input section 50, an internal power supply 60, an abnormality protection section 70, an output current detector 80, and a signal output section 90.

The NMOSFET 10 is a high-withstanding-voltage (withstanding voltage of 42 V, for example) power transistor having a drain connected to the external terminal T1 and having a source connected to the external terminal T2. The NMOSFET 10 connected in this fashion functions as a switch element (a high-side switch) for switching a current path from the application terminal of the power supply voltage VBB to the ground terminal via the load 3 between a conducting state and a cutoff state. The NMOSFET 10 is turned on when a gate driving signal G1 is at high level, and is turned off when the gate driving signal G1 is at low level.

The NMOSFET 10 may be designed such that its on-resistance value is several tens of mΩ. However, as the on-resistance value of the NMOSFET 10 is lower, it is more likely that an overcurrent flows at a time of ground fault of the external terminal T2 (i.e., at a time of short-circuit to the ground terminal or to a terminal with an equivalent low potential), which may result in abnormal heat generation. Accordingly, as the on-resistance value of the NMOSFET 10 is lower, an overcurrent protection circuit 71 and a temperature protection circuit 73, of which both will be described later, become more important.

The output current monitor 20 includes NMOSFETs 21 and 21' and a sense resistor 22, and generates a sense voltage Vs (=corresponding to a sense signal) in accordance with an output current Io flowing through the NMOSFET 10.

Both of the NMOSFETs 21 and 21', which are mirror transistors connected in parallel to the NMOSFET 10, respectively generate sense currents Is and Is' in accordance with the output current Io. The size ratio between the NMOSFET 10 and the NMOSFETs 21 and 21' is m:1 (where m>1). Accordingly, the sense currents Is and Is' are equal to 1/m of the output current Io. Like the NMOSFET 10, the NMOSFETs 21 and 21' are turned on when a gate driving signal G1 is at high level, and are turned off when a gate voltage G2 is at low level.

The sense resistor 22 (resistance: Rs) is connected between a source of the NMOSFET 21 and the external terminal T2, and is a current/voltage conversion element that generates a sense voltage Vs (=Is×Rs+Vo, where Vo represents an output voltage appearing at the external terminal T2) in accordance with the sense current Is.

The gate controller 30 generates the gate driving signal G1 with increased current capability of the gate control signal S1, and outputs the gate driving signal G1 to gates of the NMOSFETs 10 and 21, thereby controlling the turning-on/off of the NMOSFETs 10 and 21. Here, the gate controller 30 includes a function of forcibly turning off the NMOSFETs 10 and 21 independent of the gate control signal S1 in a case where an overcurrent protection signal S71 is at a logic level of a time when abnormality is detected.

The control logic section 40, on receiving an internal power supply voltage Vreg, generates the gate control signal S1. For example, when the external control signal Si is at high level (=a logic level for turning on the NMOSFET 10), the internal power supply voltage Vreg is supplied from the internal power supply 60, such that the control logic section 40 is brought into an operating state, and the gate control signal S1 becomes high level (=Vreg). On the other hand, when the external control signal Si is at low level (=a logic level for turning off the NMOSFET 10), the internal power supply voltage Vreg is not supplied from the internal power supply 60, such that the control logic section 40 is brought into a non-operating state, and the gate control signal S1 becomes low level (=GND). In addition, the control logic section 40 monitors various abnormality protection signals (the overcurrent protection signal S71, an open protection signal S72, a temperature protection signal S73, and a voltage reduction protection signal S74). The control logic section 40 also has a function of generating an output switching signal S2 in accordance with results of the monitoring of the overcurrent protection signal S71, the open protection signal S72, and the temperature protection signal S73 among the above-mentioned abnormality protection signals.

The signal input section 50 is a Schmitt trigger, which receives the external control signal Si from the external terminal T3, and transmits it to the control logic section 40 and the internal power supply 60. Here, the external control signal Si becomes high level to turn on the NMOSFET 10, and becomes low level to turn off the NMOSFET 10.

The internal power supply 60 generates a predetermined internal power supply voltage Vreg from the power supply voltage VBB, and supplies it to each of the sections of the semiconductor integrated circuit device 1. Here, whether or not the internal power supply 60 is operable is controlled in accordance with the external control signal Si. More specifically, the internal power supply 60 is in an operating state when the external control signal Si is at high level, and is in a non-operating state when the external control signal Si is at low level.

The abnormality protection section 70 is a circuit block that detects a variety of abnormalities occurring in the semiconductor integrated circuit device 1, and includes an overcurrent protection circuit 71, an open protection circuit 72, a temperature protection circuit 73, and a voltage reduction protection circuit 74.

The overcurrent protection circuit 71 generates the overcurrent protection signal S71 in accordance with a result of monitoring of the sense voltage Vs (whether or not an overcurrent abnormality of the output current Io has occurred). Here, the overcurrent protection signal S71 becomes low level when no abnormality is detected, and becomes high level when an abnormality is detected, for example.

The open protection circuit 72 generates the open protection signal S72 in accordance with a result of monitoring of the output voltage Vo (whether or not an open abnormality of the load 3 has occurred). Here, for example, the open protection signal S72 becomes low level when no abnormality is detected, and becomes high level when an abnormality is detected.

The temperature protection circuit 73 includes a temperature detection element (not shown) for detecting abnormal heat generation in the semiconductor integrated circuit device 1 (in particular, around the NMOSFET 10), and generates the temperature protection signal S73 in accordance with a result of the detection (whether or not abnormal heat generation has occurred). Here, for example, the temperature protection signal S73 becomes low level when no abnormality is detected, and becomes high level when an abnormality is detected.

The voltage reduction protection circuit 74 generates the voltage reduction protection signal S74 in accordance with a result of monitoring of the power supply voltage VBB or the internal power supply voltage Vreg (whether or not a reduced voltage abnormality has occurred). Here, for example, the voltage reduction protection signal S74 becomes low level when no abnormality is detected, and becomes high level when an abnormality is detected.

The output current detector 80 makes a source voltage of the NMOSFET 21' equal to the output voltage Vo using bias means (not shown), and thereby generates a sense current Is' (=Io/m) in accordance with the output current Io, and outputs it to the signal output section 90.

Based on an output selection signal S2, the signal output section 90 selectively outputs one of the sense current Is' (=corresponding to the detection result of the output current Io) and a fixed voltage V90 (=corresponding to an abnormality flag, which is not clearly illustrated in the figure) to the external terminal T4. Here, in a case where the sense current Is' is selectively outputted, an output detection voltage V80 (=Is'×R4) obtained by current/voltage conversion of the sense current Is' by means of the external sense resistor 4 (resistance: R4) is transmitted as the status notification signal So to the ECU 2. Here, the output detection voltage V80 increases with the output current Io, and decreases with the output current Io. On the other hand, when the fixed voltage V90 is selectively outputted, the fixed voltage V90 is transmitted as the status notification signal So to the ECU 2.

<Signal Output Section>

Figure 2:
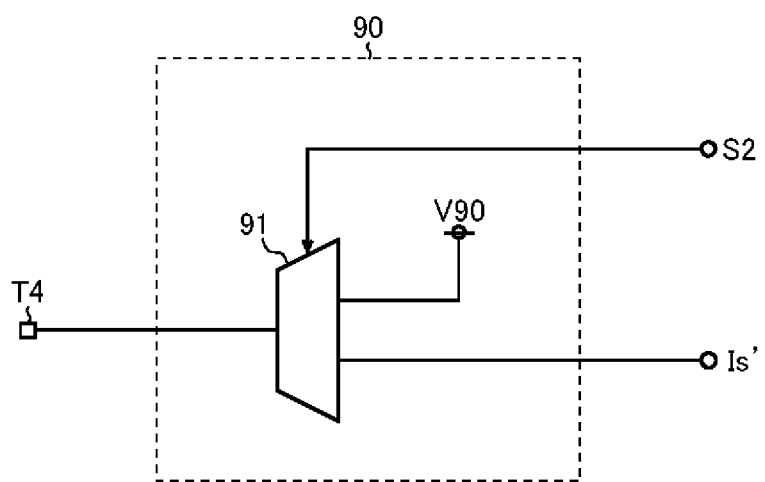
FIG. 2 is a block diagram illustrating an example of a configuration of a signal output section.

FIG. 2 is a block diagram illustrating an example of a configuration of the signal output section 90. The signal output section 90 of this configuration example includes a selector 91. The selector 91 selectively outputs the sense current Is' to the external terminal T4 when the output selection signal S2 is at a logic level (for example, low level) of when no abnormality is detected, and, when the output selection signal S2 is at a logic level (for example, high level) of when abnormality is detected, the selector 91 selectively outputs the fixed voltage V90 to the external terminal T4. Here, the fixed voltage V90 is set to a voltage value higher than an upper limit value of the above-mentioned output detection voltage V80.

According to such a signal output section 90, it is possible to transmit both the detection result of the output current Io and the abnormality flag to the ECU 2 by using a single status notification signal So, and thus to contribute to a reduced number of external terminals. Here, in a case of reading a current value of the output current Io from the status notification signal So, an A/D (analog-to-digital) conversion is performed on the status signal So. On the other hand, in a case of reading an abnormality flag from the status signal So, the logic level of the status signal So is determined by using a threshold that is slightly lower than the fixed voltage V90.

<Gate Controller>

Figure 3:
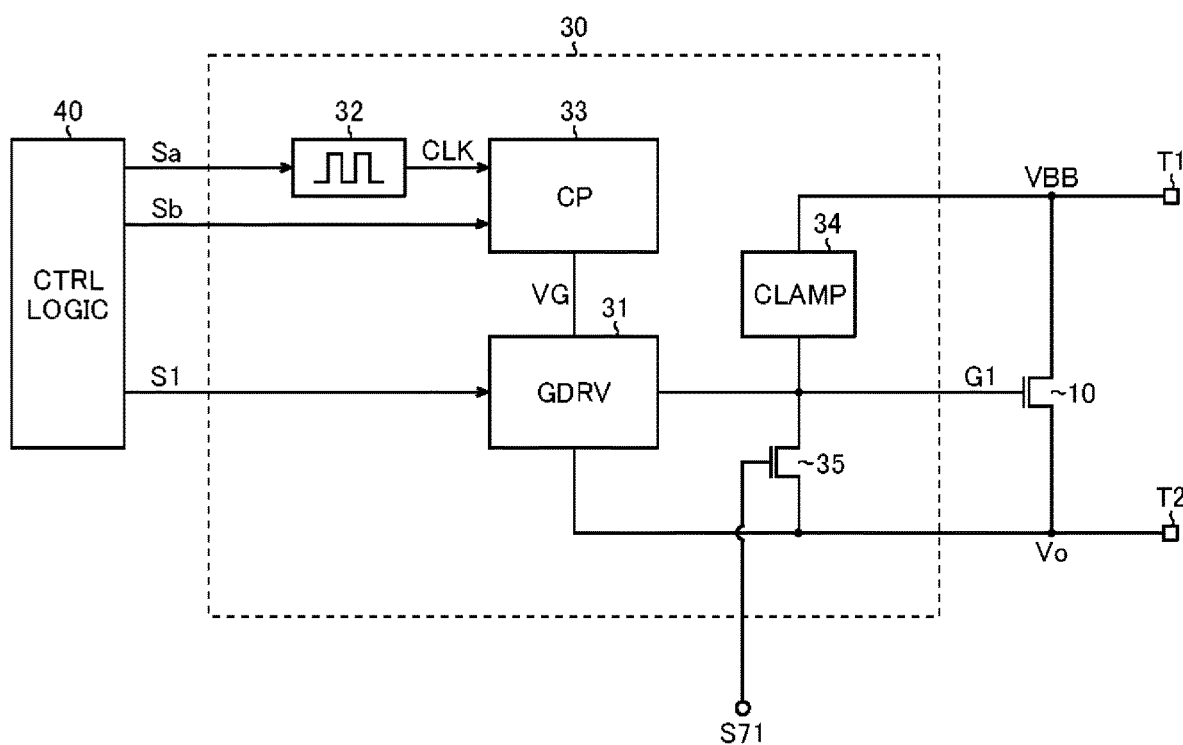
FIG. 3 is a block diagram illustrating an example of a configuration of a gate controller.

FIG. 3 is a block diagram illustrating an example of a configuration of the gate controller 30. The gate controller 30 of this configuration example includes a gate driver 31, an oscillator 32, a charge pump 33, a clamper 34, and an NMOSFET 35.

The gate driver 31 is connected between an output terminal of the charge pump 33 (=an application terminal of a boosted voltage VG) and the external terminal T2 (an application terminal of the output voltage Vo), and generates the gate driving signal G1 with increased current capability of the gate control signal S1. Here, the gate driving signal G1 is at high level (=VG) when the gate control signal S1 is at high level, and is at low level (=Vo) when the gate control signal S1 is at low level.

The oscillator 32 generates a clock signal CLK of a predetermined frequency, and outputs it to the charge pump 33. Whether or not the oscillator 32 is operable is controlled according to an enable signal Sa received from the control logic section 40.

The charge pump 33 generates the boosted voltage VG, which is higher than the power supply voltage VBB, by driving a flying capacitor by using the clock signal CLK. Here, whether or not the charge pump 33 is operable is controlled in accordance with an enable signal Sb received from the control logic section 40.

The clamper 34 is connected between the external terminal T1 (the application terminal of the power supply voltage VBB) and the gate of the NMOSFET 10. In an application in which an inductive load 3 is connected to the external terminal T2, the output voltage Vo is caused to be a negative voltage (<GND) by a counter electromotive force of the load 3 when switching the NMOSFET 10 from ON to OFF. Thus, the clamper 34 (what is called an active clamp circuit) is provided for energy absorption.

A drain of the NMOSFET 35 is connected to the gate of the NMOSFET 10. A source of the NMOSFET 35 is connected to the external terminal T2. A gate of the NMOSFET 35 is connected to an application terminal of the overcurrent protection signal S71.

In the gate controller 30 of the present configuration example, the NMOSFET 35 is turned off when the first overcurrent protection signal S71 is at low level (=a logic level of when no abnormality is detected), and accordingly the gate driving signal G1 is applied to the NMOSFET 10 in a normal fashion. On the other hand, when the overcurrent protection signal S71 is at high level (=a logic level of when abnormality is detected), the NMOSFET 35 is turned on, and accordingly a short circuit is caused between the gate and the source of the NMOSFET 10.

In this fashion, the gate controller 30 of the present configuration example has a function of controlling the gate driving signal G1 such that the NMOSFET 10 is forcibly turned off when the overcurrent protection signal S71 is at high level (=the logic level of when abnormality is detected).

<Overcurrent Protection Circuit>

Figure 4:
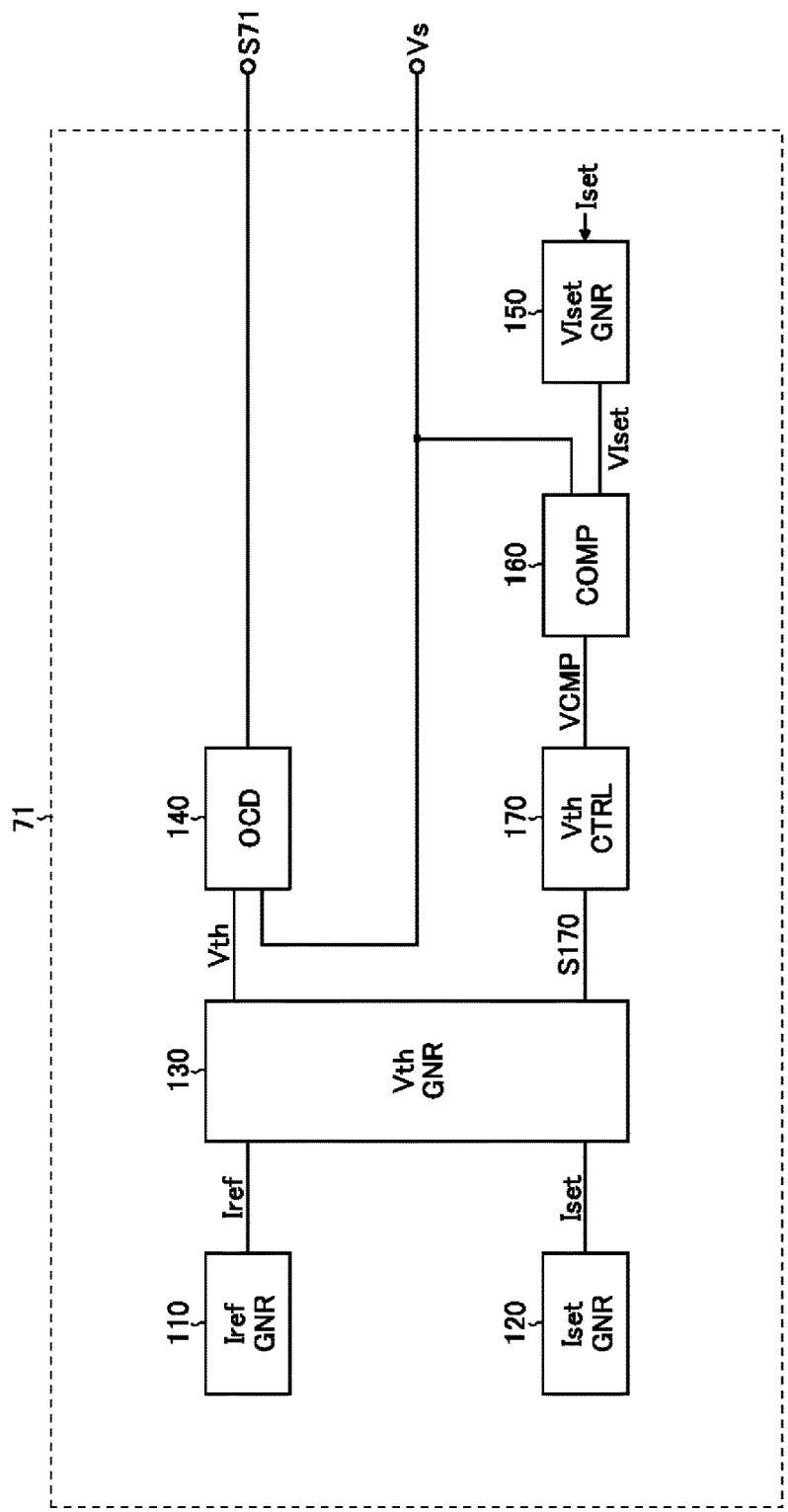
FIG. 4 is a block diagram illustrating an example of a configuration of an overcurrent protection circuit.

FIG. 4 is a block diagram illustrating an example of a configuration of the overcurrent protection circuit 71. The overcurrent protection circuit 71 of the present configuration example includes a first current generator 110, a second current generator 120, a threshold voltage generator 130, an overcurrent detector 140, a reference voltage generator 150, a comparison section 160, and a threshold controller 170.

The first current generator 110 generates a first current Iref, and outputs it to the threshold voltage generator 130. The first current Iref has a current value that is fixed inside the semiconductor integrated circuit device 1.

The second current generator 120 generates a second current Iset, and outputs it to the threshold voltage generator 130. The second current Iset has a current value that is adjustable as necessary from outside the semiconductor integrated circuit device 1.

The threshold voltage generator 130 switches, in accordance with a threshold control signal S170, whether to set a threshold voltage Vth (=corresponding to an overcurrent detection threshold) to an internal set value VthH or to an external set value VthL (VthH>VthL). Here, the internal set value VthH is a fixed value (=corresponding to a first set value) which is set in accordance with the first current Iref. On the other hand, the external set value VthL is a variable value (=corresponding to a second set value) which is set in accordance with the second current Iset.

The overcurrent detector 140 compares the sense voltage Vs with the threshold voltage Vth, and thereby generates the overcurrent protection signal S71.

The reference voltage generator 150 generates a reference voltage VIset (=corresponding to a reference value) in accordance with the second current Iset.

The comparison section 160 compares the sense voltage Vs with the reference voltage VIset, and thereby generates a comparison signal VCMP.

The threshold controller 170 monitors the comparison signal VCMP, and thereby generates the threshold control signal S170. Here, the threshold control signal S170 becomes low level when the internal set value VthH should be selected as the threshold voltage Vth, and becomes high level when the external set value VthL should be selected as the threshold voltage Vth.

<First Current Generator>

Figure 5:
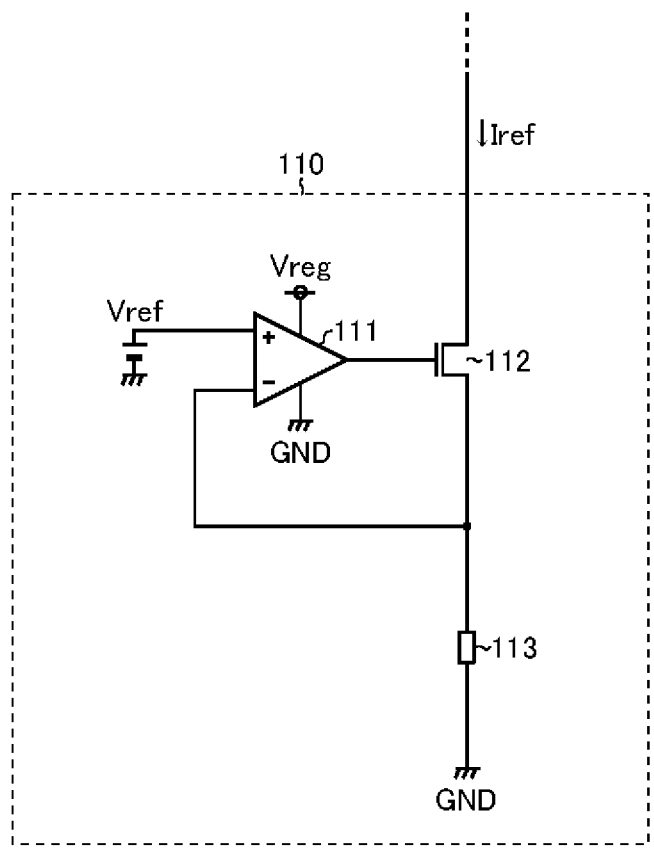
FIG. 5 is a circuit diagram illustrating an example of a configuration of a first current generator.

FIG. 5 is a circuit diagram illustrating an example of a configuration of the first current generator 110. The first current generator 110 of the present configuration example includes an operational amplifier 111, an NMOSFET 112, and a resistor 113 (resistance: R113).

A power supply terminal of the operational amplifier 111 is connected to an application terminal of the internal power supply voltage Vreg. A reference potential terminal of the operational amplifier 111 is connected to a ground terminal GND. A non-inverting input terminal (+) of the operational amplifier 111 is connected to an application terminal of a reference voltage Vref (for example, a band-gap reference voltage which is unlikely to be affected by power supply variation, temperature variation, etc.). An inverting input terminal (−) of the operational amplifier 111 and a source of the NMOSFET 112 are connected to a first terminal of the resistor 113. A second terminal of the resistor 113 is connected to the ground terminal GND. An output terminal of the operational amplifier 111 is connected to a gate of the NMOSFET 112. A drain of the NMOSFET 112 is connected to an output terminal of the first current Iref.

The operational amplifier 111 connected as described above controls the gate of the transistor 112 such that the non-inverting input terminal (+) and the inverting input terminal (−) are imaginarily short-circuited. As a result, the first current Iref (=Vref×R113) having a fixed value flows through the resistor 113.

<Second Current Generator>

Figure 6:
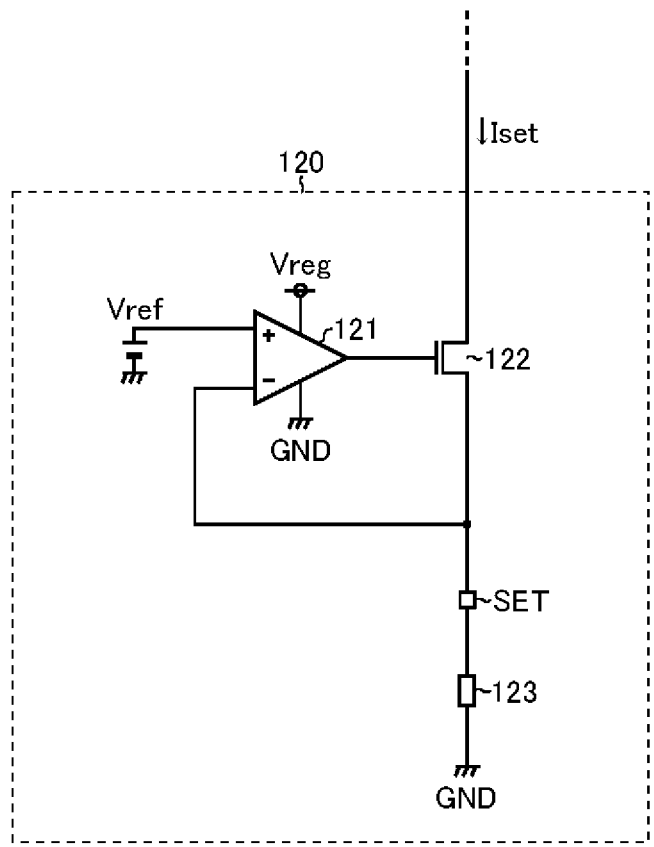
FIG. 6 is a circuit diagram illustrating an example of a configuration of a second current generator.

FIG. 6 is a circuit diagram illustrating an example of a configuration of the second current generator 120. The second current generator 120 of the present configuration example includes an operational amplifier 121, an NMOSFET 122, a resistor 123 (resistance: R123), and an external terminal SET.

To a power supply terminal of the operational amplifier 121, the application terminal of the internal power supply voltage Vreg is connected. A reference potential terminal of the operational amplifier 121 is connected to the ground terminal GND. A non-inverting input terminal (+) of the operational amplifier 121 is connected to an application terminal of the reference voltage Vref. An inverting input terminal (−) of the operational amplifier 121 and a source of the NMOSFET 122 are connected to the external terminal SET. An output terminal of the operational amplifier 121 is connected to a gate of the NMOSFET 122. A drain of the NMOSFET 122 is connected to an output terminal of the second current Iset. The resistor 123 is, outside the semiconductor integrated circuit device 1, connected between the external terminal SET and the ground terminal GND.

The operational amplifier 121 connected as described above controls the gate of the transistor 122 such that the non-inverting input terminal (+) and the inverting input terminal (−) are imaginarily short-circuited. As a result, the second current Iset (=Vref×R123) in accordance with the resistance R123 of the resistor 123 flows through the resistor 123. That is, the second current Iset increases with the resistance R123, and decreases with the resistance R123. Thus, it is possible to adjust the second current Iset as necessary by using the resistor 123, which is connected externally. Here, by employing a cascode circuit in a differential stage in the operational amplifier 121, it is possible to set the second current Iset more accurately.

<Threshold Voltage Generator, Overcurrent Detector>

Figure 7:
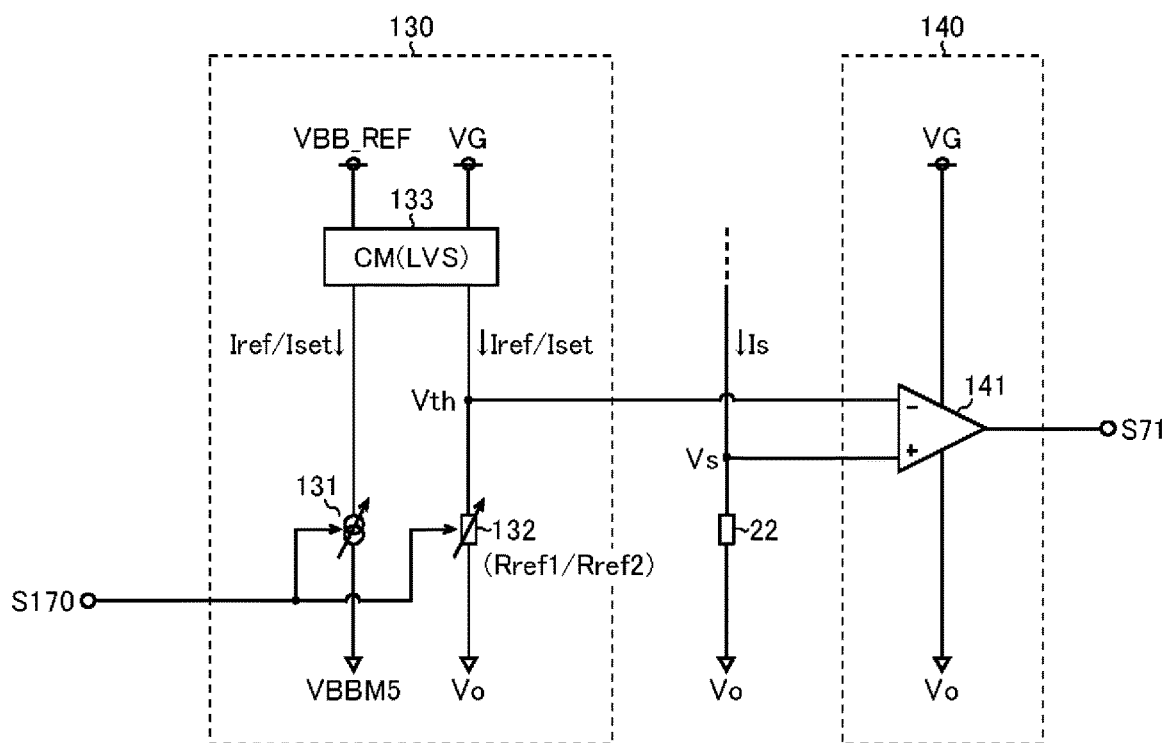
FIG. 7 is a circuit diagram illustrating an example of a configuration of a threshold voltage generator and an overcurrent detector.

FIG. 7 is a circuit diagram illustrating an example of a configuration of the threshold voltage generator 130 and the overcurrent detector 140. The threshold voltage generator 130 includes a current source 131, a resistor 132, and a current mirror 133. On the other hand, the overcurrent detector 140 includes a comparator 141.

The current source 131 is connected between a current input terminal of the current mirror 133 and an application terminal of a constant voltage VBBM5, and selectively outputs one of the first current Iref and the second current Iset in accordance with the threshold control signal S170. More specifically, the current source 131 selectively outputs the first current Iref when the threshold control signal S170 is at low level, and selectively outputs the second current Iset when the threshold control signal S170 is at high level.

The resistor 132 is connected between a current output terminal of the current mirror 133 and the application terminal of the output voltage Vo (that is, the external terminal T2), and the resistance value of the resistor 132 is switched to one of a first resistance Rref1 and a second resistance Rref2 in accordance with the threshold control signal S170. More specifically, the resistance of the resistor 132 is the first resistance Rref1 when the threshold control signal S170 is at low level, and is the second resistance Rref2 when the threshold control signal S170 is at high level.

The current mirror 133 operates on receiving a supply of a constant voltage VBB_REF and the boosted voltage VG, mirrors the first current Iref or the second current Iset inputted thereto from the current source 131, and outputs it to the resistor 132. Thus, at the current output terminal of the current mirror 133 (a high potential terminal of the resistor 132), the threshold voltage Vth is generated of which the voltage value is switched in accordance with the threshold control signal S170. More specifically, the threshold voltage Vth is the internal set value VthH (=Iref×Rref1) when the threshold control signal S170 is at low level, and the threshold voltage Vth is the external set value VthL (=Iset×Rref2) when the threshold control signal S170 is at high level. Here, the current mirror 133 functions also as a level shifter which delivers the first current Iref or the second current Iset from a first power supply system (a VBB_REF-VBBM5 system) to a second power supply system (a VG-Vo system).

Here, the constant voltage VBB_REF and the constant voltage VBBM5 are both reference voltages generated in the semiconductor integrated circuit device 1, and, for example, VBB_REF≈VBB and VBBM5≈VBB5V.

A power supply terminal of the comparator 141 is connected to the application terminal of the boosted voltage VG. A reference potential terminal of the comparator 141 is connected to the application terminal of the output voltage Vo (the external terminal T2). A non-inverting input terminal (+) of the comparator 141 is connected to an application terminal of the sense voltage Vs. An inverting input terminal (−) of the comparator 141 is connected to an application terminal of the threshold voltage Vth. The comparator 141 connected in this fashion compares the sense voltage Vs with the threshold voltage Vth, and thereby generates the overcurrent protection signal S71. The overcurrent protection signal S71 becomes low level (a logic level of when an overcurrent is detected) when the sense voltage Vs is lower than the threshold voltage Vth, and becomes high level (a logic level of when an overcurrent is not detected) when the sense voltage Vs is higher than the threshold voltage Vth.

Figure 8:
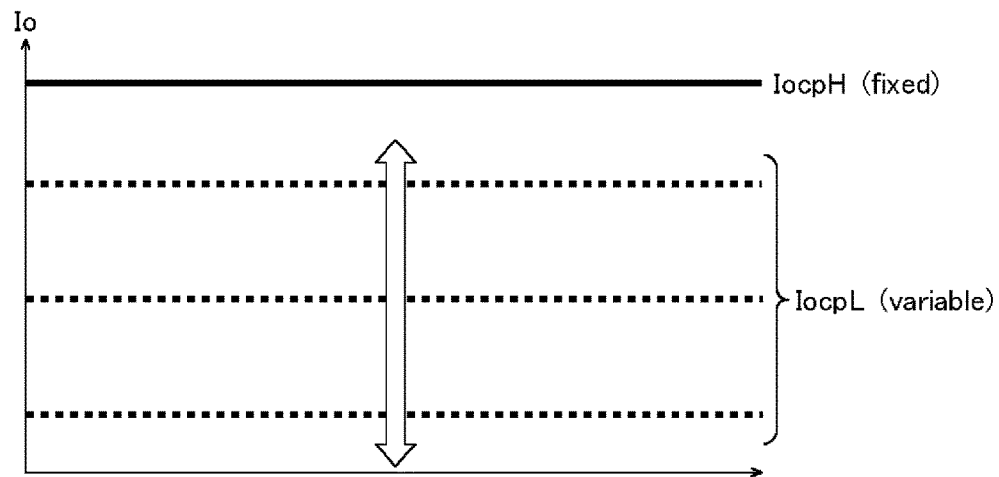
FIG. 8 is a schematic diagram illustrating an example of an overcurrent set value.

FIG. 8 is a schematic diagram illustrating an example of an overcurrent set value. As already described above, the threshold voltage Vth, which is compared with the sense voltage Vs, is switched to one of the internal set value VthH and the external set value VthL in accordance with the threshold control signal S170. This is equivalent to that the overcurrent set value Iocp, which is compared with the output current Io, is switched to one of the internal set value IocpH and the external set value IocpL.

Here, the internal set value IocpH is desirably be a fixed value (for example, about 15 A) in accordance with an on-resistance, a device withstanding voltage, or the like of the NMOSFET 10 such that the semiconductor integrated circuit device 1 will not be destroyed even in a case where short-circuit abnormality has occurred in the load 3. Thus, the internal set value IocpH is provided for a dedicated purpose of protecting the semiconductor integrated circuit device 1 itself, and often greatly deviates from a steady value of the output current Io.

On the other hand, in view of that an abnormal value of the output current Io depends on the load 3, the external set value IocpL is desirably a variable value (for example, 1 A to 10 A) in accordance with the load 3. For example, when a bulb lamp is driven, the output current Io is generally greater than when a solenoid is driven. In view of this, when a bulb lamp is driven, the external set value IocpL should be set higher than when a solenoid is driven. The output current Io when a light emitting diode is driven is generally smaller than when a solenoid is driven. In view of this, when a light emitting diode is driven, the external set value IocpL should be set lower than when a solenoid is driven.

Now, the load 3 as a target to be driven by the semiconductor integrated circuit device 1 can be a load that requires a large output current Io to instantaneously flow therethrough in its normal operation. For example, at a time of activating a bulb lamp, a rush current that is larger than in a steady-state operation instantaneously flows in the bulb lamp. Depending on the load 3, the output current Io at the time of activating the load 3 may be different, by several tens of times, from that of the time of the steady-state operation.

Thus, to achieve both the securing of an instantaneous current and overcurrent protection suitable for the load 3, it is necessary to switch the overcurrent set value Iocp, which is compared with the output current Io (and thus the threshold voltage Vth, which is compared with the sense voltage Vs) with appropriate timing.

Hereinafter, detailed descriptions will be given of means (the reference voltage generator 150, the comparison section 160, and the threshold controller 170) for achieving an appropriate switching control of the threshold voltage Vth.

<Reference Voltage Generator, Comparison Section>

Figure 9:
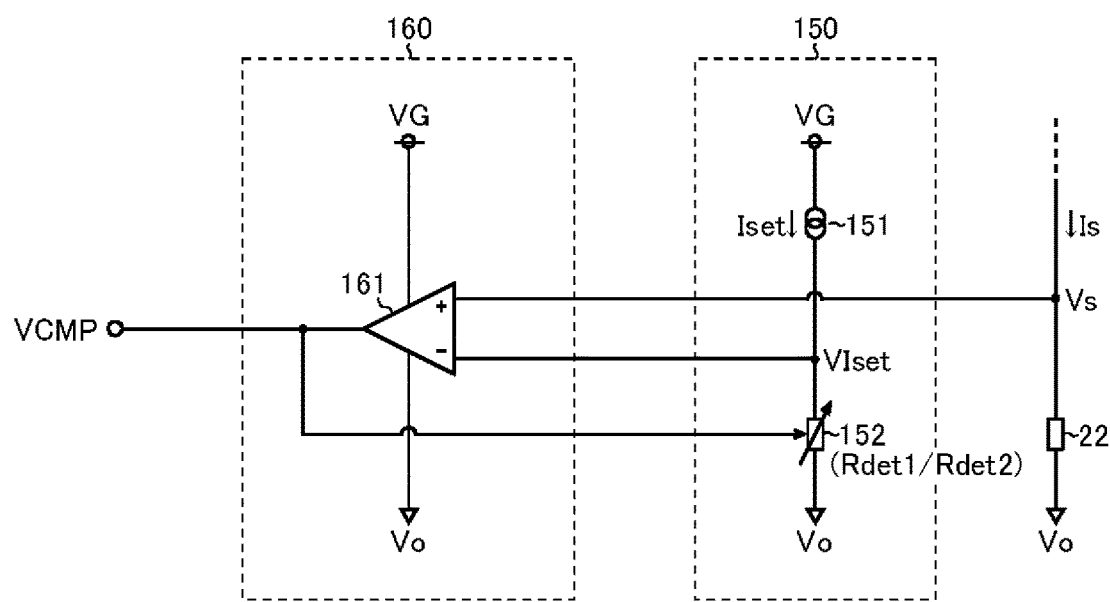
FIG. 9 is a circuit diagram illustrating an example of configurations of a reference voltage generator and a comparison section.

FIG. 9 is a circuit diagram illustrating an example of a configuration of the reference voltage generator 150 and the comparison section 160. The reference voltage generator 150 includes a current source 151 and a resistor 152 (resistance: R152). The comparison section 160 includes a comparator 161.

The current source 151 is connected between the application terminal of the boosted voltage VG and the resistor 152, and outputs the second current Iset (more precisely, a variable current equivalent to the second current Iset) which is generated by the second current generator 120.

The resistor 152 is connected between the current source 151 and the application terminal of the output voltage Vo (=the external terminal T2), and is a current/voltage conversion element that generates the reference voltage VIset (=Iset×R152) in accordance with the second current Iset.

A power supply terminal of the comparator 161 is connected to the application terminal of the boosted voltage VG. A reference potential terminal of the comparator 161 is connected to the application terminal of the output voltage Vo (the external terminal T2). A non-inverting input terminal (+) of the comparator 161 is connected to the application terminal of the sense voltage Vs. An inverting input terminal (-) of the comparator 161 is connected to an application terminal of the reference voltage VIset. The comparator 161 connected in this fashion compares the sense voltage Vs with the reference voltage VIset, and thereby generates a comparison signal VCMP. The comparison signal VCMP becomes low level when the sense voltage Vs is lower than the reference voltage VIset, and becomes high level when the sense voltage Vs is higher than the reference voltage VIset.

Here, the resistance R152 of the resistor 152 is switched to one of a first resistance Rdet1 and a second resistance Rdet2 (Rdet1>Rdet2) in accordance with the comparison signal VCMP. More specifically, the resistance R152 of the resistor 152 is the first resistance Rdet1 when the comparison signal VCMP is at low level, and is the second resistance Rdet2 when the comparison signal control signal is at high level. By thus switching and controlling the resistance R152, it is possible to give a hysteresis characteristic to the comparison section 160.

<Threshold Controller>

Figure 10:
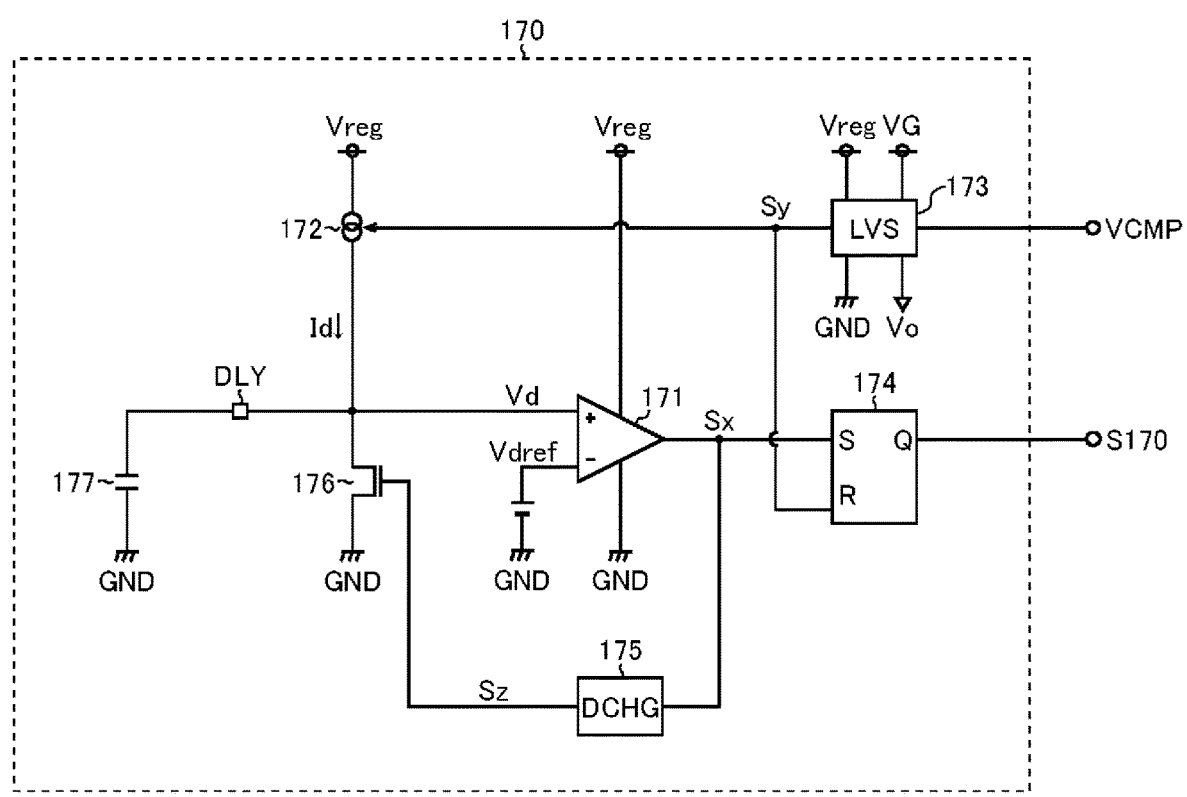
FIG. 10 is a circuit diagram illustrating an example of a configuration of a threshold controller.

FIG. 10 is a circuit diagram illustrating an example of a configuration of the threshold controller 170. The threshold controller 170 includes a comparator 171, a current source 172, a level shifter 173, an RS flip-flop 174, a discharge controller 175, an NMOSFET 176, a capacitor 177, and an external terminal DLY.

A power supply terminal of the comparator 171 is connected to the application terminal of the internal power supply voltage Vreg. A reference potential terminal of the comparator 171 is connected to the ground terminal GND. A non-inverting input terminal (+) of the comparator 171 is connected to the external terminal DLY (an application terminal of a charge voltage Vd). An inverting input terminal (-) of the comparator 171 is connected to an application terminal of a mask period expiration voltage Vdref. The comparator 171 connected in this fashion compares the charge voltage Vd with the mask period expiration voltage Vdref, and thereby generates an internal signal Sx. The internal signal Sx becomes high level when the charge voltage Vd is higher than the mask period expiration voltage Vdref, and becomes low level when the charge voltage Vd is lower than the mask period expiration voltage Vdref.

The current source 172 is connected between the application terminal of the internal power supply voltage Vreg and the external terminal DLY, and generates a predetermined charge current Id. Here, whether or not the current source 172 is operable is controlled in accordance with an internal signal Sy (=corresponding to the comparison signal VCMP after being subjected to level shifting). More specifically, the current source 172 is in an operating state when the internal signal Sy is at high level, and is in a non-operating state when the internal signal Sy is at low level.

The level shifter 173 level-shifts the comparison signal VCMP which is pulse-driven between the boosted voltage VG and the output voltage Vo to thereby generates the internal signal Sy which is pulse-driven between the internal power supply voltage Vreg and a ground voltage GND. Accordingly, when the comparison signal VCMP is at high level (=VG), the internal signal Sy is also at high level (=Vreg), and when the comparison signal VCMP is at low level (=Vo), the internal signal Sy is also at low level (=GND).

The RS flip-flop 174 outputs the threshold control signal S170 from its output terminal (Q) in accordance with the internal signal Sx inputted to its set terminal (S) and the internal signal Sy inputted to its the reset terminal (R). More specifically, the RS flip-flop 174 sets the threshold control signal S170 to high level at rising timing of the internal signal Sx, while it resets the threshold control signal S170 to low level at falling timing of the internal signal Sy.

The discharge controller 175 generates an internal signal Sz in accordance with the internal signal Sx. More specifically, the discharge controller 175 causes the internal signal Sz to rise to high level at rising timing of the internal signal Sx, and keeps the internal signal Sz at high level over a predetermined discharge period Tdchg.

The NMOSFET 176 is a discharge switch element which achieves a conducting/cutoff state between the external terminal DLY and the ground terminal GND (=between the two terminals of the capacitor 177) in accordance with the internal signal Sz. Here, the NMOSFET 176 is turned on when the internal signal Sz is at high level, and is turned off when the internal signal Sz is at low level.

The capacitor 177 is connected between the external terminal DLY and the ground terminal GND, outside the semiconductor integrated circuit device 1. When the NMOSFET 176 is in an off-state, if the charge current Id is supplied from the current source 172, the charge voltage Vd of the capacitor 177 rises. On the other hand, when the NMOSFET 176 is in an on-state, the capacitor 177 is discharged via the NMOSFET 176, and thus the charge voltage Vd lowers.

<Overcurrent Protection Circuit>

Figure 11:
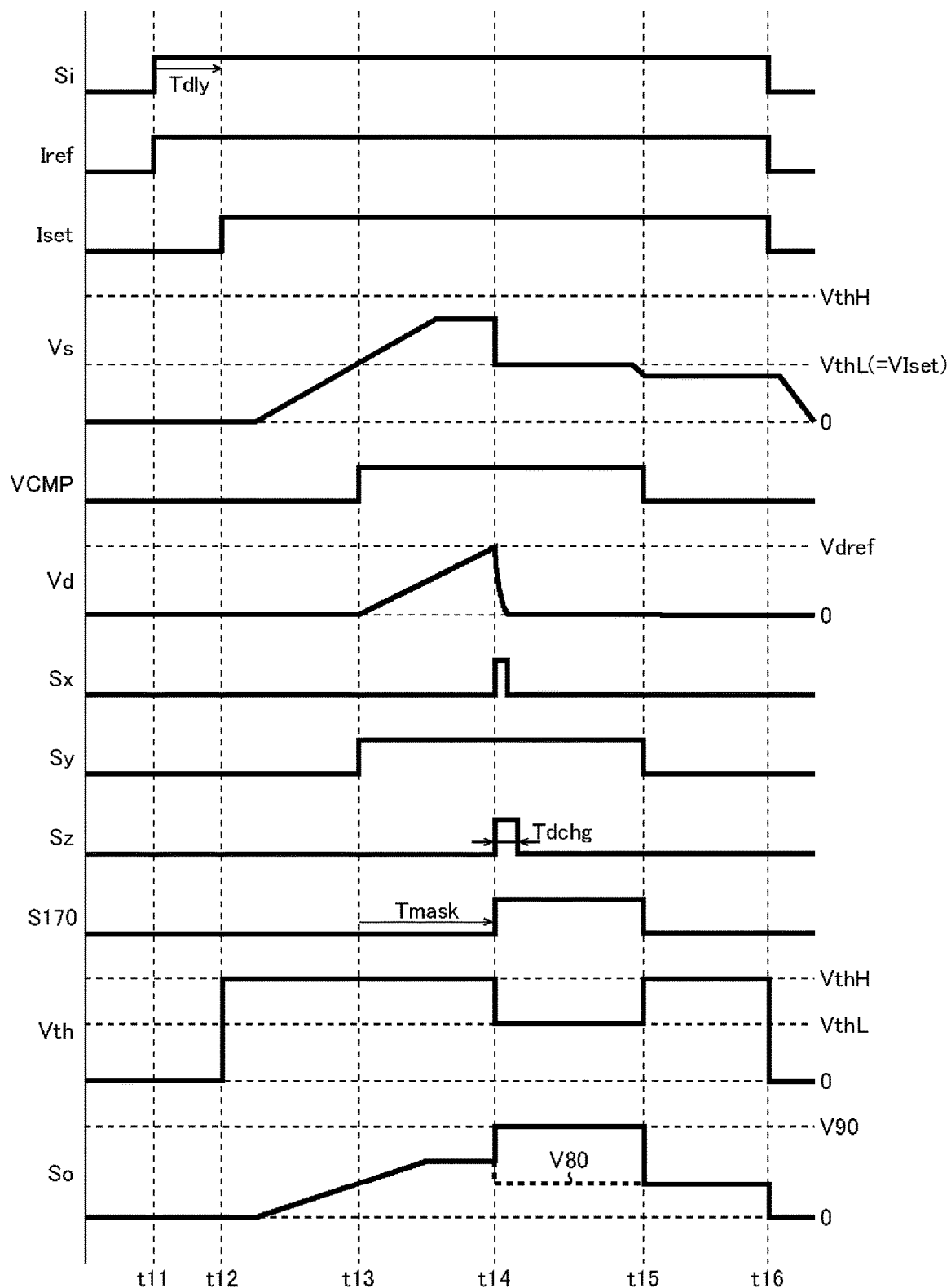
FIG. 11 is a timing chart illustrating an example of an overcurrent protection operation.

FIG. 11 is a timing chart illustrating an example of an overcurrent protection operation, in which the external control signal Si, the first current Iref, the second current Iset, the sense voltage Vs, the comparison signal VCMP, the charge voltage Vd, the internal signals Sx to Sz, the threshold control signal S170, the threshold voltage Vth, and the status notification signal So are depicted in order from the top.

At time t11, when the external control signal Si rises to high level, an operation of generating the first current Iref is started without delay. However, at time t11, since shutdown of the semiconductor integrated circuit device 1 has not been cancelled and the NMOSFET 10 is maintained in an off state, no output current Io flows in the NMOSFET 10. Accordingly, the sense voltage Vs is maintained at 0V.

At time t12, when a predetermined activation delay period Tdly (e.g., 5 μs) elapses from time t11, the shutdown of the semiconductor integrated circuit device 1 is cancelled. As a result, the NMOSFET 10 is turned on and the output current Io starts to flow, and thus the sense voltage Vs starts to rise. Further, at time t12, operations of generating the second current Iset and the reference voltage VIset (in the figure, VIset=VthL) in accordance with the second current Iset are also started. Note that, at time t12, the sense voltage Vs is lower than the reference voltage VIset, and thus the comparison signal VCMP becomes low level. Accordingly, the threshold control signal S170 becomes low level, and thus a state is reached where the internal set value VthH is selected as the threshold voltage Vth.

At time t13, when the sense voltage Vs becomes higher than the reference voltage VIset, the comparison signal VCMP becomes high level. As a result, the internal signal Sy becomes high level, and thus the charge voltage Vd starts to rise. Note that, at time t13, the charge voltage Vd is lower than the mask period expiration voltage Vdref, and thus the internal signal Sx remains at low level. Accordingly, the threshold control signal S170 is maintained at low level, and thus the internal set value VthH remains selected as the threshold voltage Vth. Hence, even though the sense voltage Vs is higher than the external set value VthL (=VIset), overcurrent protection is not applied.

At time t14, when the charge voltage Vd becomes higher than the mask period expiration voltage Vdref, the internal signal Sx becomes high level. Accordingly, the threshold control signal S170 is set to high level, and thus the threshold voltage Vth is switched to the external set value VthL. As a result, from time t14, overcurrent protection is applied so that the sense voltage Vs will not become higher than the external set value VthL. Further, when the internal signal Sx rises to high level, the internal signal Sz also becomes high level and remains at high level over the predetermined discharge period Tdchg, and thus the charge voltage Vd is discharged to 0 V. Here, the discharge period Tdchg is desirably a time (for example, 3 μs) that is shorter than the above-mentioned activation delay period Tdly.

Thus, when the threshold voltage Vth is set to the internal set value VthH, the threshold voltage Vth is switched to the external set value VthL at a time point when a predetermined mask period Tmask (=time t13 to time t14) elapses with the sense voltage Vs remaining higher than the reference voltage VIset. Accordingly, it is possible to achieve overcurrent protection suitable for the load 3.

On the other hand, although not illustrated in the figure, even when the sense voltage Vs is higher than the reference voltage VIset for an instant, if the sense voltage Vs becomes lower than the reference voltage VIset again before expiration of the mask period Tmask, the threshold voltage Vth remains maintained at the internal set value VthH. Thus, no unintended overcurrent protection is applied, so that it is possible to secure an instantaneous current on startup.

Furthermore, naturally, when the threshold voltage Vth is set to the internal set value VthH, if the sense voltage Vs becomes higher than the internal set value VthH, at that time point, without delay, overcurrent protection is applied. Thus, it is possible to forcibly turn off the NMOSFET 10 as soon as abnormality such as a short circuit occurs in the load 3, and this helps prevent destruction of the semiconductor integrated circuit device 1 itself.

Here, the mask period Tmask described above is a variable value that is adjustable as necessary by using the capacitor 177, which is connected externally. More specifically, the larger the capacitance of the capacitor 177 is, the longer the mask period Tmask is, and the smaller the capacitance of the capacitor 177 is, the shorter the mask period Tmask is. However, as the mask period Tmask becomes longer, overcurrent protection using the external set value VthL is started with more delay. Thus, it is desirable to set the mask period Tmask to a minimum necessary length, considering duration of the instantaneous current at the start-up.

Furthermore, it is also possible to appropriately select whether or not to provide the mask period Tmask depending on the purpose for which the semiconductor integrated circuit device 1 is used (the kind of the load 3). For example, when the external terminal DLY is open, the mask period Tmask is substantially zero, which is equivalent to a case where only the external set value VthL is provided. Furthermore, for example, when the external terminal DLY is short-circuited with the ground terminal GND, the mask period Tmask is infinite, which is equivalent to a case where only the internal set value VthH is provided.

At time t15, when the sense voltage Vs becomes lower than the reference voltage VIset, the comparison signal VCMP becomes low level, an thus the internal signal Sy becomes low level. As a result, the threshold control signal S170 is reset to low level, and thus the threshold voltage Vth is switched to the internal set value VthH.

Thus, when the threshold voltage Vth is set to the external set value VthL, at a time point when the sense voltage Vs becomes lower than the reference voltage VIset, the threshold voltage Vth is switched to the internal set value VthH. That is, when the overcurrent protection operation using the external set value VthL is canceled, the overcurrent protection circuit 71 is returned to its initial state at startup.

At time t16, when the external control signal Si falls to low level, the semiconductor integrated circuit device 1 is shut down, and thus the above series of operation is ended.

Here, with attention on the status notification signal So, during a period when no overcurrent is detected (a period excluding from time t14 to time t15), an output detection voltage V80 (see also the broken line in the figure), which corresponds to a detection result of the output current Io, is selectively outputted. On the other hand, during a period when an overcurrent is detected (a period from time t14 to time t15), instead of the output detection voltage V80, a constant voltage V90, which corresponds to the abnormality flag, is selectively outputted.

Figure 12:
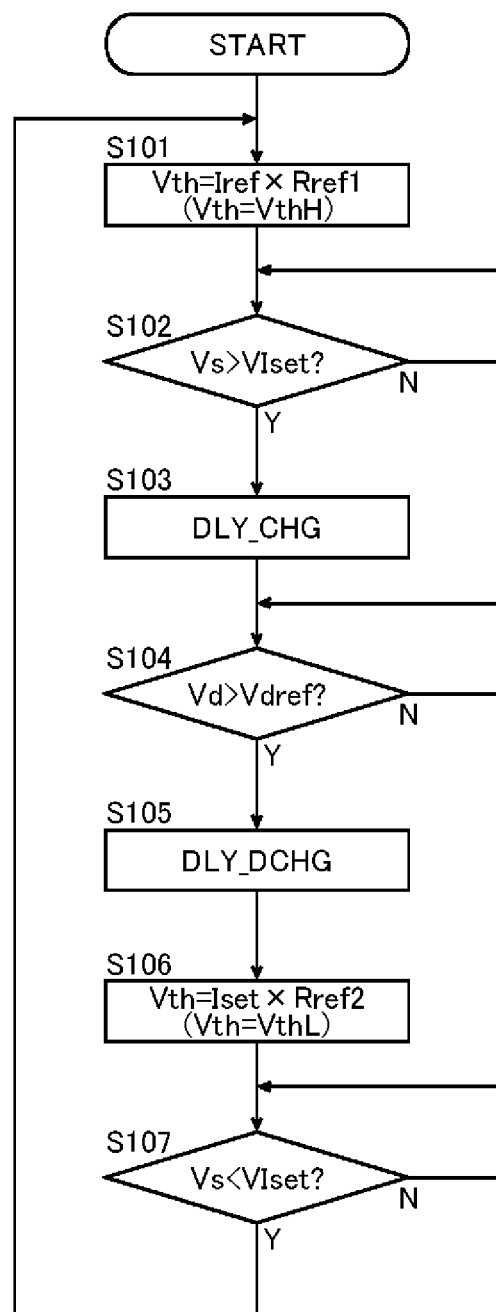
FIG. 12 is a flowchart illustrating an example of a threshold switching operation.

FIG. 12 is a flowchart illustrating an example of a threshold switching operation. When the flow starts, first, in step S101, the threshold voltage Vth is set to the internal set value VthH(=Iref×Rref1) (corresponding to time t12 of FIG. 11).

Next, in step S102, a determination is made on whether or not the sense voltage Vs is higher than the reference voltage VIset. When a Yes-determination is made here, the flow proceeds to step S103. On the other hand, when a No-determination is made, the flow returns to step S102, and the determination in this step is repeated (which corresponds to from time t12 to time t13 of FIG. 11).

In step S103, in response to the Yes-determination made in step S102, the capacitor 177 starts to be charged (which corresponds to time t13 of FIG. 11).

Next, in step S104, a determination is made on whether or not the charge voltage Vd is higher than the mask period expiration voltage Vdref. When a Yes-determination is made here, the flow proceeds to step S105. On the other hand, when a No-determination is made, the flow returns to step S104, and the determination in this step is repeated (which corresponds to from time t13 to time t14 of FIG. 11).

In step S105, in response to the Yes-determination made in step S104, the capacitor 177 is discharged. In step S106, the threshold voltage Vth is switched to the external set value VthL (=Iset×Rref2). Steps S105 and S106 correspond to time t14 of FIG. 11.

Next, in step S107, a determination is made on whether or not the sense voltage Vs is lower than the reference voltage VIset. When a Yes-determination is made here, the flow returns to step S101, and the threshold voltage Vth is switched to the internal set value VthH (=Iref×Rref1) again (corresponding to time t15 of FIG. 11). On the other hand, when a No-determination is made, the flow returns to step S107, and the determination in this step is repeated (corresponding to from time t14 to time t15 of FIG. 11).

<Usage Example>

Figure 13:
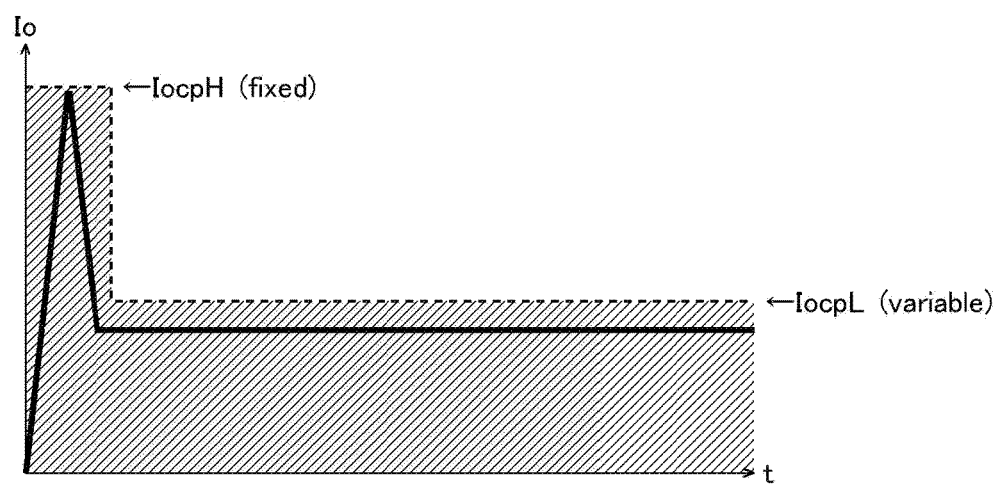
FIG. 13 is a schematic diagram illustrating a first usage example of an overcurrent protection circuit.

FIG. 13 is a schematic diagram illustrating a first usage example of the overcurrent protection circuit 71. For example, when the load 3 is a bulb lamp, as indicated by the solid line in the figure, the output current Io flowing as an instantaneous current on startup is larger than that in a steady-state operation. However, with the above-described mask period Tmask set appropriately, this instantaneous current can be excluded from detection targets, so that no overcurrent protection is unintendedly applied. That is, on startup, when an excessive instantaneous current flows, the output current Io and a first set value IocpH are compared with each other, whereas the output current Io and a second set value IocpL are compared with each other in the steady-state operation. Accordingly, the output current Io has a driving zone that is indicated in the figure with hatching.

Figure 14:
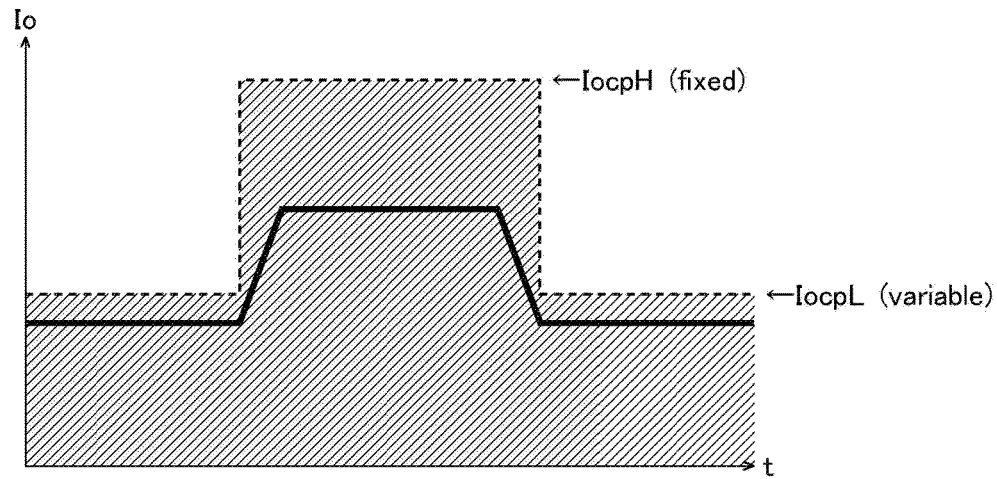
FIG. 14 is a schematic diagram illustrating a second usage example of the overcurrent protection circuit.

FIG. 14 is a schematic diagram illustrating a second usage example of the overcurrent protection circuit 71. For example, when the load 3 is a motor, as indicated by the solid line in the figure, the output current Io flowing as an instantaneous current when the motor is locked is larger than that in a steady-state operation. However, with the above-described mask period Tmask set appropriately, this instantaneous current can be excluded from detection targets, and thus no overcurrent protection is unintendedly applied. That is, when the motor is locked and an excessive instantaneous current flows, the output current Io and the first set value IocpH are compared with each other, whereas the output current Io and the second set value IocpL are compared with each other in the steady-state operation. Accordingly, the output current Io has a driving zone that is indicated in the figure with hatching.

<Effects and Advantages>

As has been discussed above, in the overcurrent protection circuit 71, as the overcurrent set value Iocp to be compared with the output current Io, there are prepared two values, which are, namely, the first set value IocpH and the second set value IocpL, and furthermore, the predetermined mask period Tmask is provided as a moratorium period before switching from the first set value IocpH to the second set value IocpL.

By adopting this configuration, it is possible to achieve both the securing of an instantaneous current and overcurrent protection suitable for the load 3. In particular, during the steady-state operation of the load 3, the second set value IocpL, which is sufficiently lower than the first set value IocpH, is compared with the output current Io, and this helps prevent a large current that is too much larger than a drive current of the load 3 from continuously flowing as the output current Io. This allows a harness to be connected to the load 3 to have a diameter that is smaller than diameters of conventional harnesses.

Furthermore, with the overcurrent protection circuit 71, there is no need of performing overcurrent protection suitable for the load 3 in the ECU 2, and this makes it possible to reduce burden on the ECU 2 (=constant monitoring of the output current Io, for example), and thus to achieve the ECU 2 without a microcomputer.

Semiconductor Integrated Circuit Device (Second Embodiment)

Figure 15:
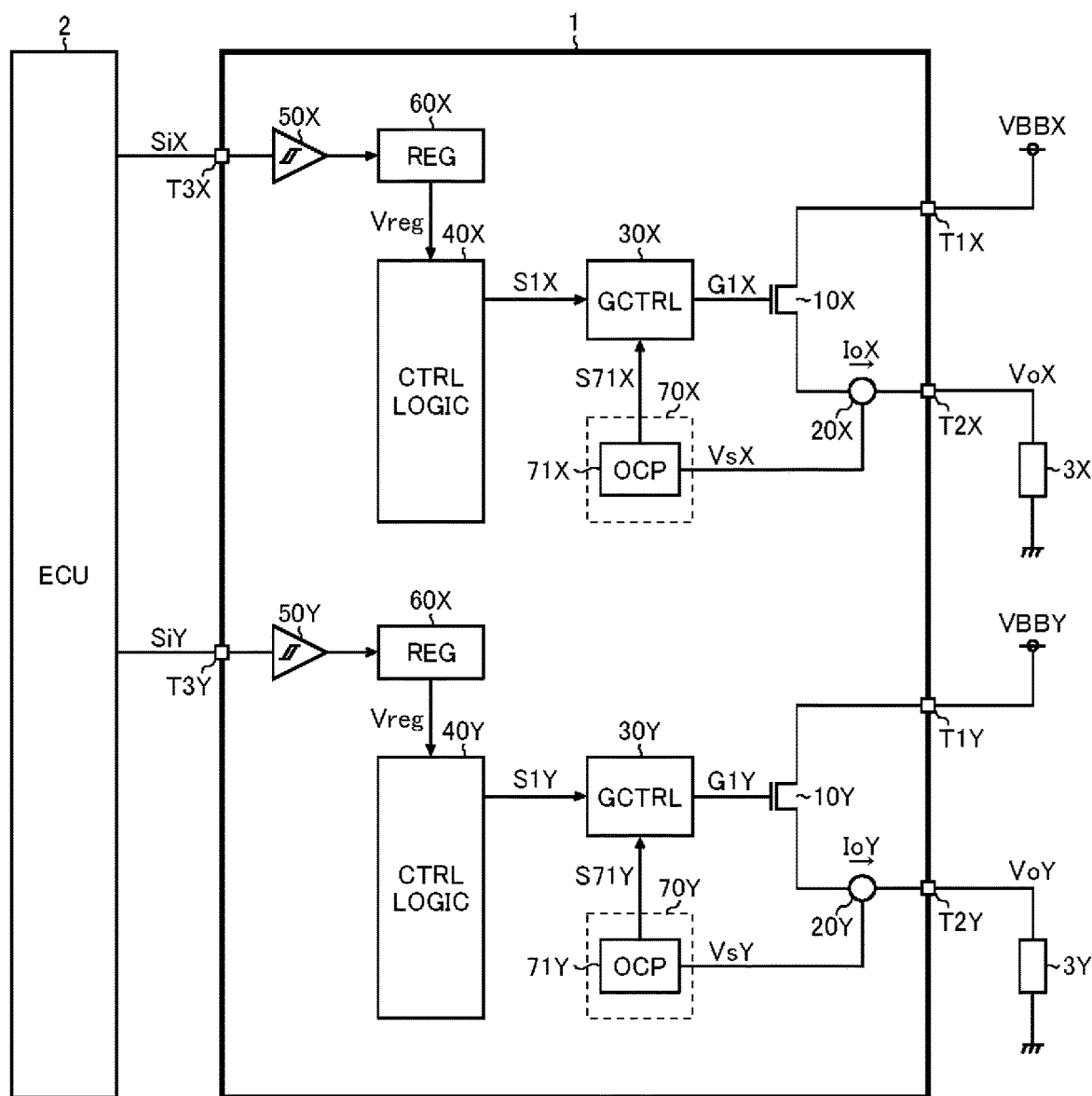
FIG. 15 is a block diagram illustrating a second embodiment of the semiconductor integrated circuit device.

FIG. 15 is a block diagram illustrating a second embodiment of the semiconductor integrated circuit device 1. The semiconductor integrated circuit device 1 of the present embodiment is based on the first embodiment (FIG. 1), but, for the purpose of separately driving two-channel loads 3X and 3Y, it has the above-described components (the functional blocks 10 to 90, the external terminals T1 to T4, various voltages, currents and signals, etc.) for each channel.

The letter "X" is appended to ends of symbols for components related to the driving of the load 3X, while the letter "Y" is appended to ends of symbols for components related to the driving of the load 3Y, but their operations and functions are basically the same as those of the above-mentioned components denoted by symbols without the letter "X" or "Y" at their ends. For example, operations and functions of the NMOSFETs 10X and 10Y are basically the same as those of the NMOSFET 10 described above. This applies also to the other components. Hence, unless there is something especially noteworthy, overlapping descriptions of the operations and functions of the components will be omitted. Furthermore, the output current detector 80 and the signal output section 90 are not clearly indicated in the figure, and these function blocks will be described later.

In the semiconductor integrated circuit device 1 of the present embodiment, which is capable of separately driving the two-channel loads 3X and 3Y, there is a case where startup takes place at different timings for the different channels. Thus, in order to achieve both the securing of an instantaneous current and overcurrent protection suitable for the load of each channel, the mask period Tmask described above needs to be set correctly independent of the difference in startup timing.

The simplest configuration to achieve this is obtained by preparing the above-described overcurrent protection circuit 71 (see FIG. 4) for each of the two channels, that is, by providing overcurrent protection circuits 71X and 71Y in parallel with each other. However, such a configuration requires two external terminals DLY for setting the mask period Tmask, which may necessitate the changing of the package of the semiconductor integrated circuit device 1 or invite an increase in cost of the semiconductor integrated circuit device 1.

To prevent such disadvantages, an overcurrent protection circuit 71 is proposed below which is capable of correctly setting the mask period Tmask for each channel without adding another external terminal DLY.

Figure 16:
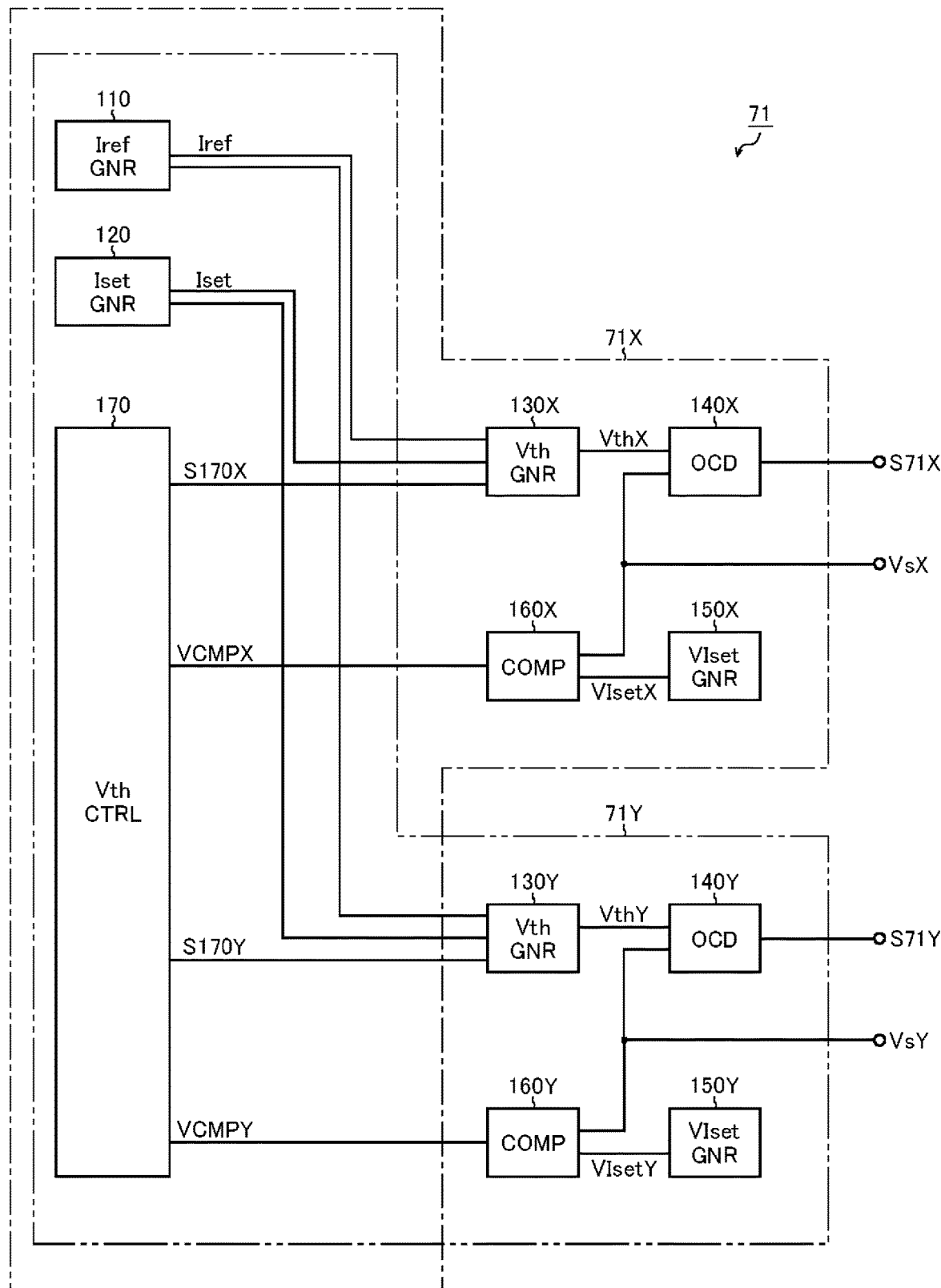
FIG. 16 is a block diagram illustrating an example of a configuration of a two-channel overcurrent protection circuit.

FIG. 16 is a block diagram illustrating an example of a configuration of the overcurrent protection circuit 71 having a two-channel configuration. The overcurrent protection circuit 71 of this configuration example includes a first current generator 110, a second current generator 120, threshold voltage generators 130X and 130Y, overcurrent detectors 140X and 140Y, reference voltage generators 150X and 150Y, comparison sections 160X and 160Y, and a threshold controller 170.

Of the above components, the first current generator 110, the second current generator 120, the threshold voltage generator 130X, the overcurrent detector 140X, the reference voltage generator 150X, the comparison section 160X, and the threshold controller 170 function as an overcurrent protection circuit 71X for a first channel.

On the other hand, of the above components, the first current generator 110, the second current generator 120, the threshold voltage generator 130Y, the overcurrent detector 140Y, the reference voltage generator 150Y, the comparison section 160Y, and the threshold controller 170 function as an overcurrent protection circuit 71Y for a second channel.

In this fashion, in the overcurrent protection circuit 71 of the present configuration example, the first current generator 110, the second current generator 120, and the threshold controller 170 are shared by the first channel and the second channel.

The first current generator 110 generates the first current Iref and outputs it to the threshold voltage generators 130X and 130Y. The first current Iref has a current value that is fixed inside the semiconductor integrated circuit device. The first current generator 110 is configured basically as illustrated in FIG. 5 referred to above. As means for outputting the first current Iref to both of the threshold voltage generators 130X and 130Y, there may be used, for example, a current mirror having current output terminals for two systems.

The second current generator 120 generates the second current Iset and outputs it to the threshold voltage generators 130X and 130Y. The second current Iset has a current value that is adjustable as necessary from outside the semiconductor integrated circuit device 1. The second current generator 120 is configured basically as illustrated in FIG. 6 referred to above. As means for outputting the second current Iset to both of the threshold voltage generators 130X and 130Y, there may be used, for example, a current mirror having current output terminals for two systems.

The threshold voltage generator 130X switches, in accordance with a threshold control signal S170X, whether to set a threshold voltage VthX to an internal set value VthXH or to an external set value VthXL (where VthXH>VthXL). The internal set value VthXH is a fixed value (=corresponding to the first set value) that is set in accordance with the first current Iref. On the other hand, the external set value VthXL is a variable value (=corresponding to the second set value) that is set in accordance with the second current Iset.

The threshold voltage generator 130Y switches, in accordance with a threshold control signal S170Y, whether to set a threshold voltage VthY to an internal set value VthYH or to an external set value VthYL (where VthXH>VthXL). The internal set value VthYH is a fixed value (=corresponding to the third set value) that is set in accordance with the first current Iref. On the other hand, the external set value VthYL is a variable value (=corresponding to the fourth set value) that is set in accordance with the second current Iset.

The overcurrent detector 140X compares a sense voltage VsX, which is in accordance with an output current IoX, with the threshold voltage VthX, and thereby generates an overcurrent protection signal S71X.

The overcurrent detector 140Y compares a sense voltage VsY, which is in accordance with an output current IoY, with the threshold voltage VthY, and thereby generates an overcurrent protection signal S71Y.

The reference voltage generator 150X generates a reference voltage VIsetX (=corresponding to a first reference value) in accordance with the second current Iset.

The reference voltage generator 150Y generates a reference voltage VIsetY (=corresponding to a second reference value) in accordance with the second current Iset.

The comparison section 160X compares the sense voltage VsX with the reference voltage VIsetX, and thereby generates a comparison signal VCMPX.

The comparison section 160Y compares the sense voltage VsY with the reference voltage VIsetY, and thereby generates a comparison signal VCMPY.

The threshold controller 170 monitors both the comparison signals VCMPX and VCMPY, and thereby generates the threshold control signals S170X and S170Y.

Here, the threshold control signal S170X becomes low level when the internal set value VthXH should be selected as the threshold voltage VthX, and becomes high level when the external set value VthXL should be selected as the threshold voltage VthX.

On the other hand, the threshold control signal S170Y becomes low level when the internal set value VthYH should be selected as the threshold voltage VthY, and becomes high level when the external set value VthYL should be selected as the threshold voltage VthY.

Threshold Controller (First Example)

Figure 17:
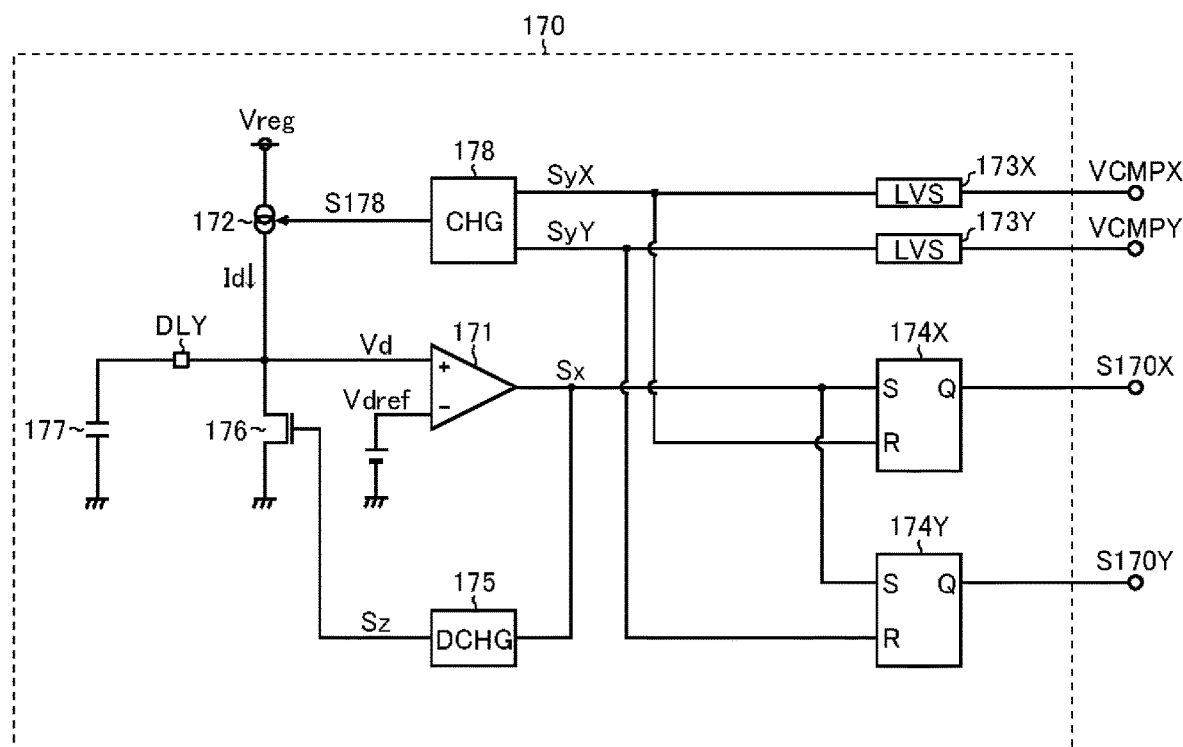
FIG. 17 is a block diagram illustrating a first example of a threshold controller.

FIG. 17 is a block diagram illustrating a first example of the threshold controller 170. The threshold controller 170 of the present example is based on FIG. 10, which has been referred to above, and, as means for achieving a two-channel configuration, the threshold controller 170 includes the comparator 171, the current source 172, level shifters 173X and 173Y, RS flip-flops 174X and 174Y, the discharge controller 175, the NMOSFET 176, the capacitor 177, a charge controller 178, and the external terminal DLY.

The comparator 171 compares the charge voltage Vd (=a charge voltage of the capacitor 177 which appears at the external terminal DLY) inputted to its non-inverting input terminal (+) with the mask period expiration voltage Vdref inputted to its inverting input terminal (−), and thereby generates the internal signal Sx. The internal signal Sx becomes high level when the charge voltage Vd is higher than the mask period expiration voltage Vdref, and becomes low level when the charge voltage Vd is lower than the mask period expiration voltage Vdref. This is similar to what is described in FIG. 10, which has been referred to above.

The current source 172 generates the charge current Id in accordance with a charge control signal S178. More specifically, the current source 172 outputs the charge current Id when the charge control signal S178 is at high level, and stops the charge current Id when the charge control signal S178 is at low level.

The level shifter 173X level-shifts the comparison signal VCMPX, and thereby generates an internal signal SyX.

The level shifter 173Y level-shifts the comparison signal VCMPY, and thereby generates an internal signal SyY.

The RS flip-flop 174X outputs the threshold control signal S170X from its output terminal (Q) in accordance with the internal signal Sx inputted to its set terminal (S) and the internal signal SyX inputted to its the reset terminal (R). More specifically, the RS flip-flop 174X sets the threshold control signal S170X to high level at rising timing of the internal signal Sx, while it resets the threshold control signal S170X to low level at falling timing of the internal signal SyX.

The RS flip-flop 174Y outputs the threshold control signal S170Y from its output terminal (Q) in accordance with the internal signal Sx inputted to its set terminal (S) and the internal signal SyY inputted to its reset terminal (R). More specifically, the RS flip-flop 174Y sets the threshold control signal S170Y to high level at rising timing of the internal signal Sx, while it resets the threshold control signal S170Y to low level at falling timing of the internal signal SyY.

The discharge controller 175 generates the internal signal Sz in accordance with the internal signal Sx. More specifically, the discharge controller 175 causes the internal signal Sz to rise to high level at rising timing of the internal signal Sx, and keeps the internal signal Sz at high level over the predetermined discharge period Tdchg. This is similar to what is described in FIG. 10, which has been referred to above.

The NMOSFET 176 is a discharge switch element which achieves a conducting/cutoff state between the external terminal DLY and the ground terminal GND (=between the two terminals of the capacitor 177) in accordance with the internal signal Sz. Here, the NMOSFET 176 is turned on when the internal signal Sz is at high level, and is turned off when the internal signal Sz is at low level. This also is similar to what is described in FIG. 10, which has been referred to above.

The capacitor 177 is connected between the external terminal DLY and the ground terminal GND, outside the semiconductor integrated circuit device 1. When the NMOSFET 176 is OFF, if the charge current Id is supplied from the current source 172, the charge voltage Vd of the capacitor 177 rises. On the other hand, when the NMOSFET 176 is ON, the capacitor 177 is discharged via the NMOSFET 176, and thus the charge voltage Vd falls. This also is similar to what is described in FIG. 10, which has been referred to above.

The charge controller 178 generates the charge control signal S178 in accordance with both the internal signals SyX and SyY (thus the comparison signals VCMPX and VCMPY). The charge control signal S178 basically rises to high level (=a logic level at a time of charging) at rising timing of the internal signal SyX or SyY.

Figure 18:
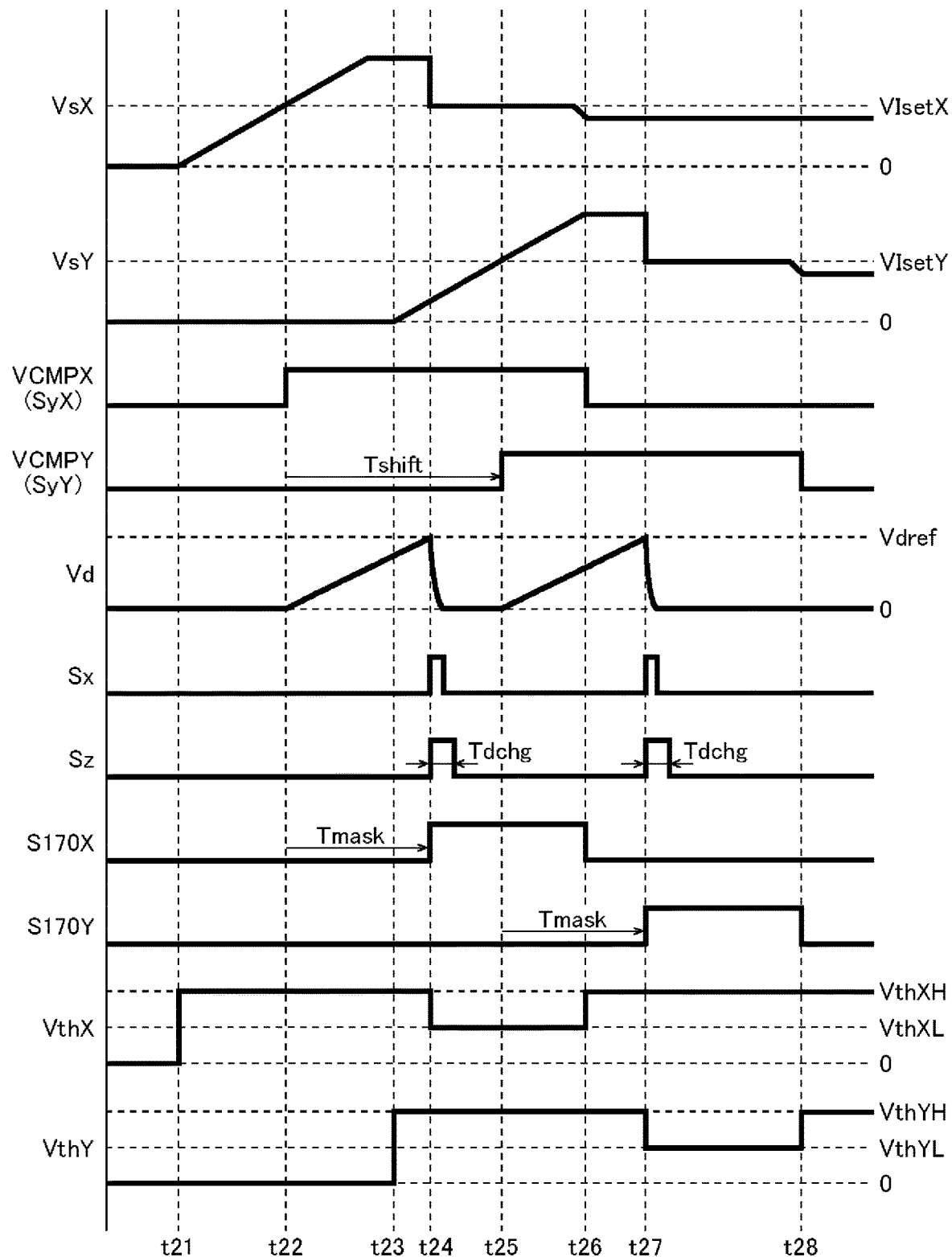
FIG. 18 is a timing chart illustrating a threshold switching operation of the first example.

FIG. 18 is a timing chart illustrating the threshold switching operation of the first example, in which the sense voltages VsX and VsY, the comparison signals VCMPX and VCMPY (equivalent to the internal signals SyX and SyY), the charge voltage Vd, the internal signals Sx and Sz, the threshold control signals S170X and S170Y, and the threshold voltages VthX and VthY are depicted in order from the top.

At time t21, when the NMOSFET 10X is turned on, the sense voltage VsX starts to rise. However, at time t21, the sense voltage VsX is lower than the reference voltage VIsetX, and thus the comparison signal VCMPX (=the internal signal SyX) becomes low level. Accordingly, the threshold control signal S170X becomes low level, and thus a state is reached where the internal set value VthXH is selected as the threshold voltage VthX. Here, at time t21, the NMOSFET 10Y remains OFF, and the sense voltage VsY is maintained at 0V.

At time t22, when the sense voltage VsX becomes higher than the reference voltage VIsetX, the comparison signal VCMPX (=the internal signal SyX) becomes high level, and the charge voltage Vd starts to rise. However, since the charge voltage Vd is lower than the mask period expiration voltage Vdref at time t22, the internal signal Sx remains at low level. Accordingly, the threshold control signal S170X is maintained at low level, and the internal set value VthH remains selected as the threshold voltage VthX. Thus, even though the sense voltage VsX is higher than the external set value VthXL (=VIsetX), no overcurrent protection is applied. Here, at time t22, the NMOSFET 10Y remains OFF, and the sense voltage VsY is maintained at 0V.

At time t23, the NMOSFET 10Y is turned on, and the sense voltage VsY starts to rise. Here, at time t23, the sense voltage VsY is lower than the reference voltage VIsetY, and thus the comparison signal VCMPY (=the internal signal SyY) becomes low level. Accordingly, the threshold control signal S170Y becomes low level, and thus a state is reached where the internal set value VthYH is selected as the threshold voltage VthY.

At time t24, when the charge voltage Vd becomes higher than the mask period expiration voltage Vdref, the internal signal Sx becomes high level. At time t24, the comparison signal VCMPX (=the internal signal SyX) has already become high level (=a logic level at a time of reset cancellation). Accordingly, the threshold control signal S170X is set to high level, and the threshold voltage VthX is switched to the external set value VthXL. As a result, at time t24, overcurrent protection starts to be applied so that the sense voltage VsX will not become higher than the external set value VthXL. Further, when the internal signal Sx rises to high level, the internal signal Sz also becomes high level and remains at high level over the predetermined discharge period Tdchg, and thus the charge voltage Vd is discharged to 0 V.

That is, with attention on the threshold voltage VthX, when the threshold voltage VthX is set to the internal set value VthXH, the threshold voltage VthX is switched to the external set value VthXL at a time point when a predetermined mask period Tmask (=time t22 to time t24) elapses with the sense voltage VsX remaining higher than the reference voltage VIsetX. Accordingly, it is possible to achieve overcurrent protection suitable for the load 3X.

On the other hand, at time t24, the comparison signal VCMPY (=the internal signal SyY) is maintained at high level (=a logic level at a time of reset). Accordingly, even when the internal signal Sx rises to high level, the threshold control signal S170Y is maintained at low level, and thus the internal set value VthYH remains selected as the threshold voltage VthY.

At time t25, when the sense voltage VsY becomes higher than the reference voltage VIsetY, the comparison signal VCMPY (=the internal signal SyY) becomes high level, and thus the charge voltage Vd starts to rise again. However, since the charge voltage Vd is lower than the mask period expiration voltage Vdref at time t25, the internal signal Sx remains at low level. Accordingly, the threshold control signal S170Y is maintained at low level, and the internal set value VthYH remains selected as the threshold voltage VthY. Thus, even though the sense voltage VsY is higher than the external set value VthYL (=VIsetY), no overcurrent protection is applied.

In the following description, a period between rising timing of the comparison signal VCMPX and rising timing of the comparison signal VCMPY (=a period between first-channel startup timing and second-channel startup timing) will be referred to as a shift period Tshift.

At time t26, when the sense voltage VsX becomes lower than the reference voltage VIsetX, the comparison signal VCMPX (=the internal signal SyX) becomes low level. As a result, the threshold control signal S170X is reset to low level, and thus the threshold voltage VthX is switched to the internal set value VthXH.

That is, with attention on the threshold voltage VthX, when the threshold voltage VthX is set to the external set value VthXL, at a time point when the sense voltage VsX becomes lower than the reference voltage VIsetX, the threshold voltage VthX is switched to the internal set value VthXH.

At time t27, when the charge voltage Vd becomes higher than the mask period expiration voltage Vdref, the internal signal Sx becomes high level. Further, at time t27, the comparison signal VCMPY (=the internal signal SyY) has already become high level (=a logic level at a time of reset cancellation). Accordingly, the threshold control signal S170Y is set to high level, and the threshold voltage VthY is switched to the external set value VthXL. As a result, from time t27, overcurrent protection is applied so that the sensing voltage VsY will not become higher than the external set value VthYL. Also, when the internal signal Sx becomes high level, the internal signal Sz also becomes high level and remains at high level over the predetermined discharge period Tdchg, and thus the charge voltage Vd is discharged to 0 V.

That is, with attention on the threshold voltage VthY, when the threshold voltage VthY is set to the internal set value VthYH, the threshold voltage VthY is switched to the external set value VthYL at a time point when a predetermined mask period Tmask (=time t25 to time t27) elapses with the sense voltage VsY remaining higher than the reference voltage VIsetY. Accordingly, it is possible to achieve overcurrent protection suitable for the load 3Y.

Here, at time t27, the comparison signal VCMPX(=the internal signal SyX) has already fallen to low level (=the logic level at the time of reset). Accordingly, even when the internal signal Sx rises to high level, the threshold control signal S170X is maintained at low level, and thus the internal set value VthXH remains selected as the threshold voltage VthX.

At time t28, when the sense voltage VsY becomes lower than the reference voltage VIsetY, the comparison signal VCMPY (=the internal signal SyY) becomes low level. As a result, the threshold control signal S170Y is reset to low level, and thus the threshold voltage VthY is switched to the internal set value VthYH.

That is, with attention on the threshold voltage VthY, when the threshold voltage VthY is set to the external set value VthYL, at a time point when the sense voltage VsY becomes lower than the reference voltage VIsetY, the threshold voltage VthY is switched to the internal set value VthYH.

As is clear from the above-described series of threshold switching operation, with the threshold controller 170 of the present example, without the need of adding another external terminal DLY, it is possible to correctly set the mask period Tmask (from time t22 to time t23, and from time t25 to time t27) for each channel.

The above description has been given with reference to the present figure by taking as an example a case where Tshift>Tmask; in a case where Tshift≤Tmask by contrast, problems may occur in the above-described series of threshold switching operation. Hereinafter, a detailed description will be given of such problems.

Figure 19:
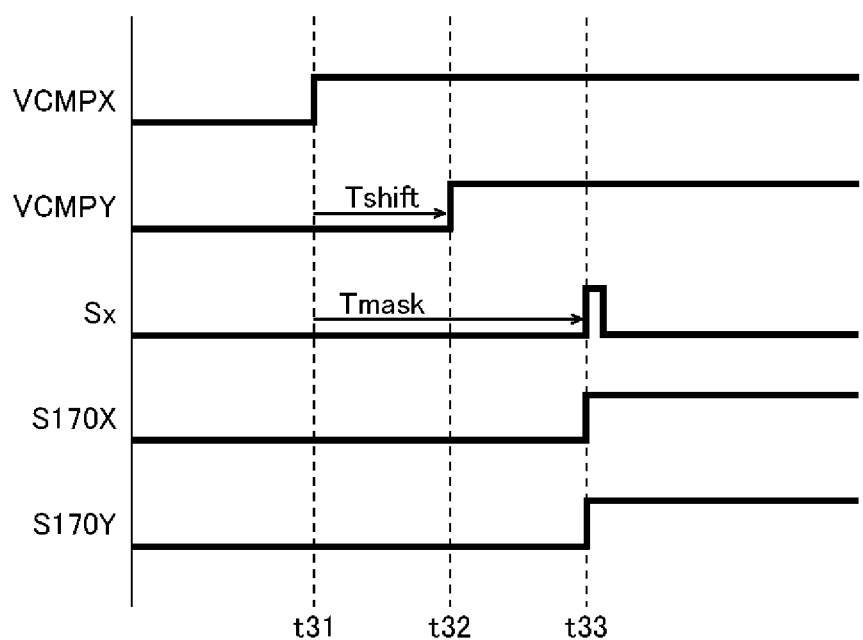
FIG. 19 is a timing chart illustrating a disadvantage of the first example.

FIG. 19 is a timing chart illustrating problems that the first example suffers, in which there are depicted behaviors of the comparison signals VCMPX and VCMPY, the internal signal Sx, and the threshold control signals S170X and S170YT, in order from the top, observed in a case where Tshift<Tmask.

In the example illustrated in the figure, where Tshift<Tmask, after the comparison signal VCMPX rises to high level at time t31, the comparison signal VCMOY rises to high level at time t32 before the mask period Tmask elapses.

Accordingly, when the mask period Tmask elapses from time t31 and the internal signal Sx rises to high level at time t33, not only the comparison signal VCMPX but also the comparison signal VCMPY has already become high level. Thus, at time t33, the threshold control signals S170X and S170Y simultaneously become high level.

In this case, a preceding channel, which is started up first, does not have a problem in particular, but with respect to a subsequent channel, which is started up after the preceding channel, the mask period Tmask is shorter by the length of the shift period Tshift, and this may make it difficult to secure an instantaneous current. Hereinafter, a second example of the threshold controller 170 will be proposed which is capable of solving this problem.

Threshold Controller (Second Example)

Figure 20:
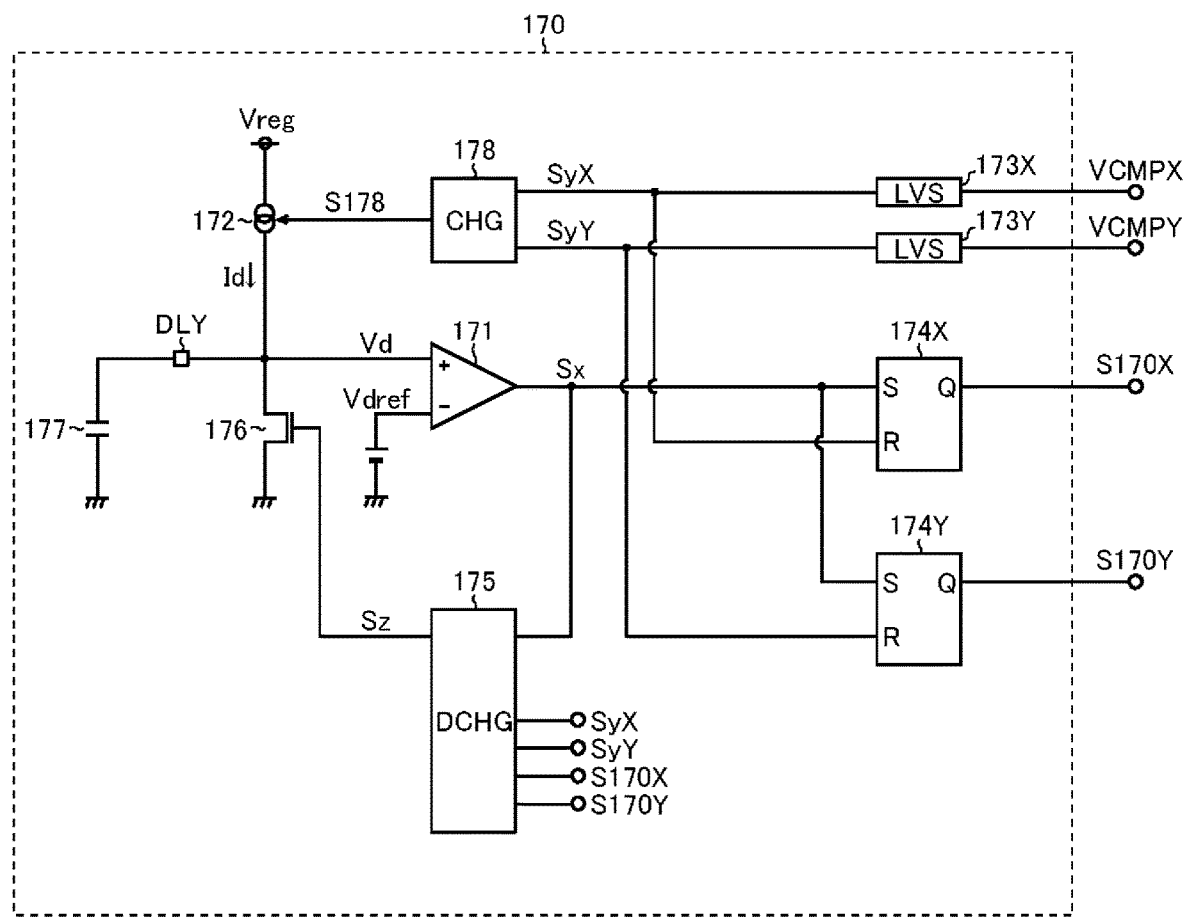
FIG. 20 is a block diagram illustrating a second example of the threshold controller.

FIG. 20 is a block diagram illustrating a second example of the threshold controller 170. The threshold controller 170 of the present example is based on the first example (FIG. 17) described above, and is characterized in that the discharge controller 175 accepts input of not only the internal signal Sx but also the internal signals SyX and SyY (equivalent to the comparison signals VCMPX and VCMPY) and the threshold control signals S170X and S170Y. The following description will focus on the configuration and the operation of the discharge controller 175.

Figure 21:
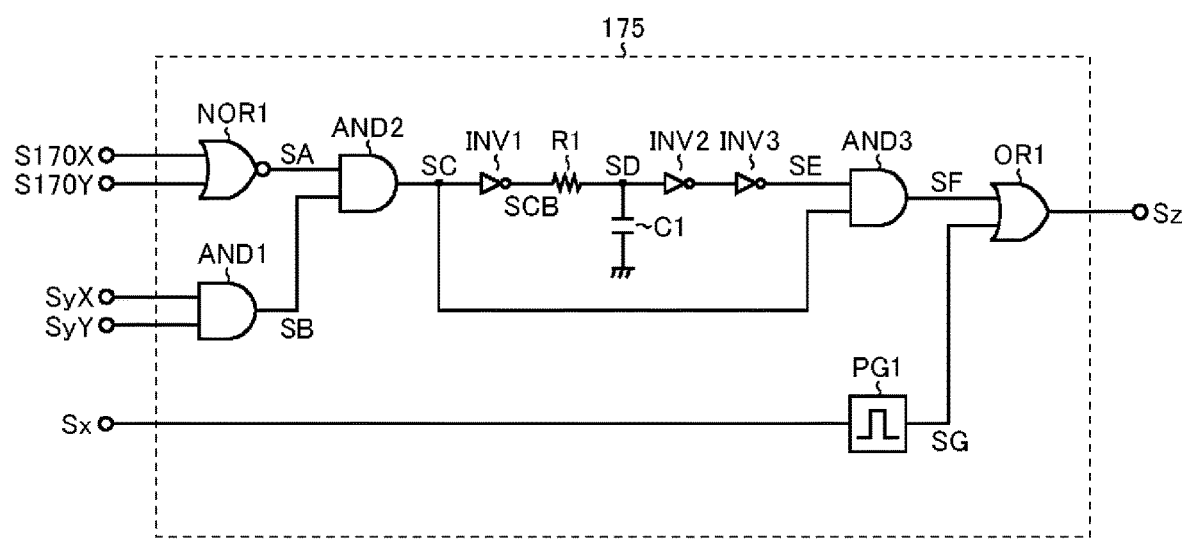
FIG. 21 is a block diagram illustrating an example of a configuration of a discharge controller.

FIG. 21 is a block diagram illustrating an example of a configuration of the discharge controller 175. The discharge controller 175 illustrated in the present figure includes an NOR operation unit NOR1, AND operation units AND1 to AND3, an OR operation unit OR1, inverters INV1 to INV3, a pulse generator PG1, a resistor R1, and a capacitor C1.

The NOR operation unit NOR1 performs a NOR operation on the threshold control signals S170X and S170Y, and thereby generates a logic signal SA. Accordingly, the logic signal SA becomes high level when the threshold control signals S170X and S170Y are both at low level, and becomes low level when at least one of the threshold control signals S170X and S170Y is at high level.

The AND operation unit AND1 performs an AND operation on the internal signals SyX and SyY, and thereby generates a logic signal SB. Accordingly, the logic signal SB becomes high level when the internal signals SyX and SyY are both high level, and becomes low level when at least one of the internal signals SyX and SyY is at low level.

The AND operation unit AND2 performs an AND operation on the logic signals SA and SB, and thereby generates a logic signal SC. Accordingly, the logic signal SC becomes high level when the logic signals SA and SB are both at high level, and becomes low level when at least one of the logic signals SA and SB is at low level.

The inverter INV1 inverts the logic of the logic signal SC, and thereby generates an inverted logic signal SCB.

The resistor R1 and the capacitor C1 generate a logic signal SD having an integrated waveform obtained by dulling the inverted logic signal SCB with a predetermined time constant $\tau$ (=R×C).

The inverters INV2 and INV3 compare the logic signal SD with a predetermined threshold (=a logic inversion threshold of the inverters INV2 and INV3), and thereby generate a logic signal SE having a rectangular waveform.

The AND operation unit AND3 performs an AND operation on the logic signals SC and SE, and thereby generates a logic signal SF. Accordingly, the logic signal SF becomes high level when the logic signals SC and SE are both at high level, and becomes low level when at least one of the logic signals SC and SE is at low level.

At rising timing of the internal signal Sx, the pulse generator PG1 generates, in the logic signal SG, a one-shot pulse having a predetermined pulse width (=corresponding to the discharge period Tdchg).

The OR operation unit OR1 performs an OR operation on the logic signals SF and SG, and thereby generates the internal signal Sz. Accordingly, the internal signal Sz becomes low level when the logic signals SF and SG are both at low level, and becomes high level when at least one of the logic signals SF and SG is at high level.

Figure 22:
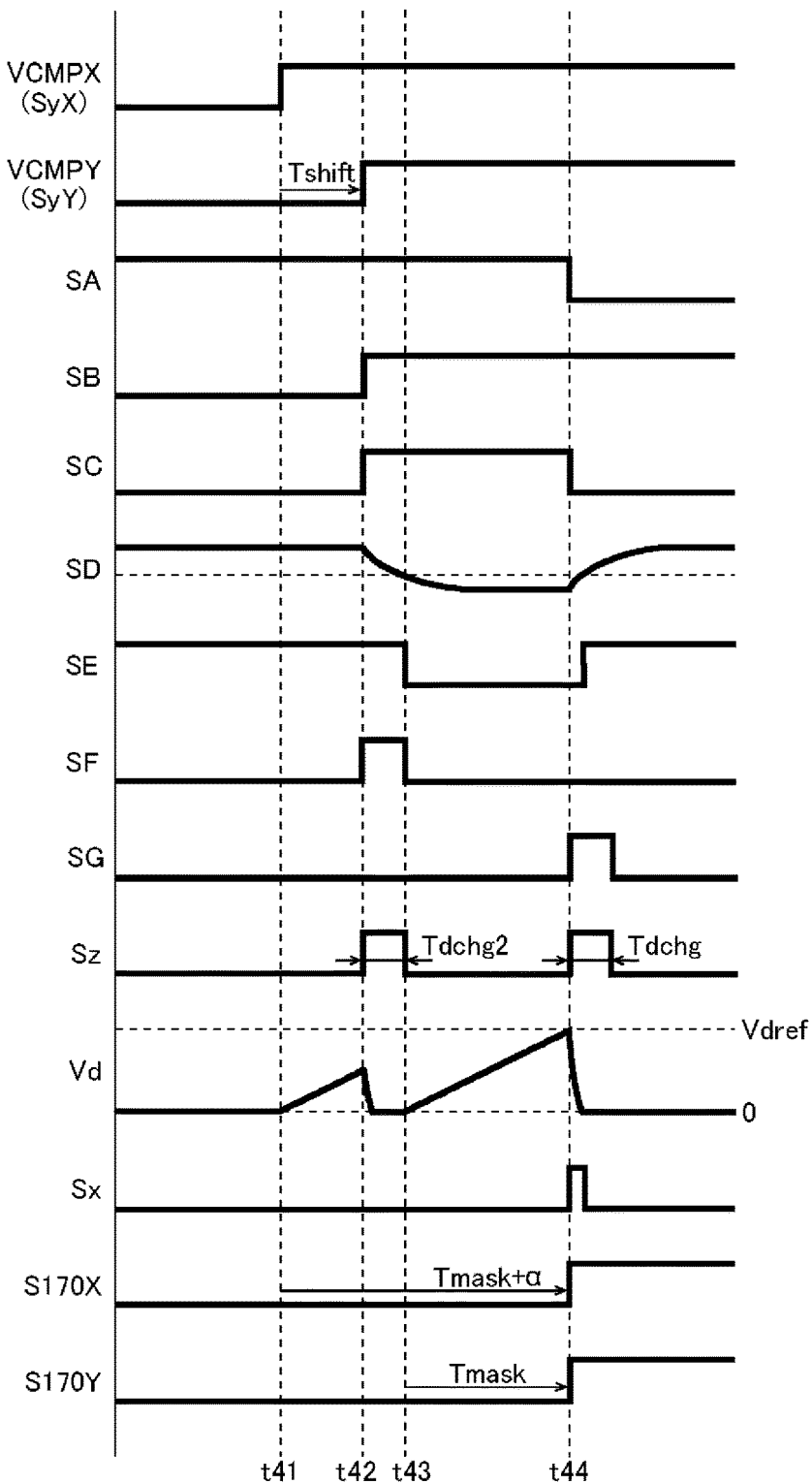
FIG. 22 is a timing chart illustrating a threshold switching operation of the second example.

FIG. 22 is a timing chart illustrating the threshold switching operation of the second example, in which there are depicted behaviors of the comparison signals VCMPX and VCMPY (equivalent to the internal signals SyX and SyY), the logic signals SA to SG, the internal signal Sz, the charge voltage Vd, the internal signal Sx, and the threshold control signals S170X and S170Y, in order from the top, observed in a case where Tshift<Tmask.

In the example illustrated in the present figure, after the comparison signal VCMPX rises to high level at time t41, the comparison signal VCMPY rises to high level at time t42 before the mask period Tmask elapses. That is, at time t42, the charge voltage Vd has not reached the mask period expiration voltage Vdref yet, and the internal signal Sx has not risen to high level yet.

Here, with attention on an internal operation of the discharge controller 175, at time t42, the threshold control signals S170X and S170Y are both at low level, and accordingly the logic signal SA is at high level. At time t42, the comparison signals VCMPX and VCMPY (and thus the internal signals SyX and SyY) are both at high level, and thus the logic signal SB rises to high level. Accordingly, the logic signal SC rises to high level, and the logic signal SD starts to fall with the time constant $\tau$. However, at time t42, the logic signal SD is higher than the logic inversion threshold of the inverter INV2, and thus the logic signal SE is maintained at high level.

Accordingly, at time t42, since the logic signals SC and SE both become high level, the logic signal SF rises to high level, and thus the internal signal Sz rises to high level. As a result, the charge voltage Vd is discharged.

In this fashion, when, after one of the comparison signals VCMPX and VCMPY rises to high level and a charging operation of the capacitor 177 is started, the other one of the comparison signals VCMPX and VCMPY rises to high level before the charge voltage Vd becomes higher than the mask period expiration voltage Vdref, the capacitor 177 is discharged, and thus an operation of counting the mask period Tmask is reset.

Then, at time t43, when the logic signal SD becomes lower than the logic inversion threshold of the inverter INV2, the logic signal SE falls to low level. As a result, the logic signal SF falls to low level, and thus the internal signal Sz falls to low level, the discharge operation described above is stopped and the charge voltage Vd starts to rise again.

Here, a high level period of the logic signal SF (=from time t42 to time t43) corresponds to the discharge period Tdchg2 of the charge voltage Vd. The discharge period Tdchg2 is settable arbitrarily in accordance with the time constant $\tau$ of the resistor R1 and the capacitor C1, and it may be set, for example, to be equal to the above-described discharge period Tdchg (for example, 3 μs).

Then, at time t44, when the charge voltage Vd becomes higher than the mask period expiration voltage Vdref, the internal signal Sx rises to high level. At this time point, not only the comparison signal VCMPX but also the comparison signal VCMPY has already become high level. Thus, at time t44, the threshold control signal S170X and S170Y simultaneously become high level.

Through the threshold switching operation described above, as to the threshold control signal S170Y of the subsequent channel, the length of the mask period becomes equal to an original set length (=Tmask). On the other hand, as to the threshold control signal S170X of the preceding channel, the length of the mask period becomes longer (=Tmask+α) than the original set length.

Here, at time t44, when the internal signal Sx rises to high level, since the one-shot pulse having the predetermined pulse width (=Tdchg) is generated in the logic signal SG, the internal signal Sz becomes high level, and the charge voltage Vd is discharged.

Further, at time t44, when the threshold control signals S170X and S170Y each rise to high level, the logic signal SA falls to low level, and the logic signal SC falls to low level. As a result, the logic signal SD starts to rise with the time constant $\tau$, and at a time point when the logic signal SD becomes higher than the logic inversion threshold of the inverter INV2, the logic signal SE rises to high level. However, at this time point, the logic signal SC has already become low level, and thus the logic signal SF is maintained at low level.

As described above, with the threshold controller 170 of the present example, even in a case where Tshift<Tmask, the mask period of the subsequent channel is not reduced, and thus, there is no risk that it will become difficult to secure an instantaneous current.

Here, the above description has been given with reference to the present figure by taking as an example a case where Tshift<Tmask; under a critical condition where Tshift=Tmask (or, Tshift≈Tmas) by contrast, even by adopting the second example, there is a risk of an unexpected malfunction. This problem will be described below in detail.

Figure 23:
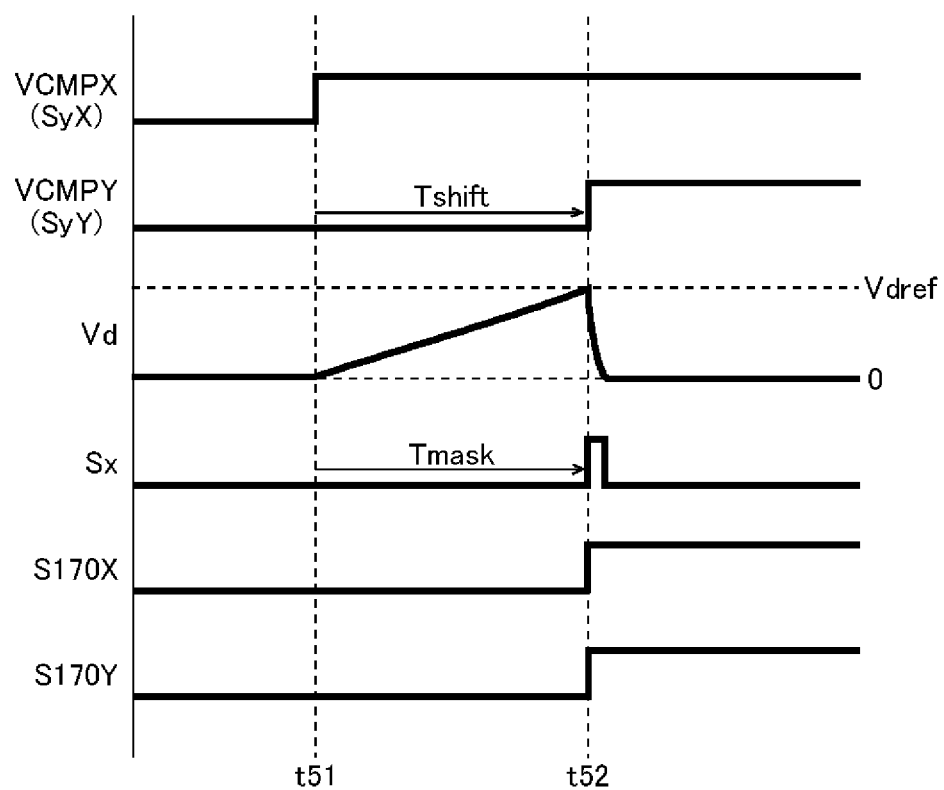
FIG. 23 is a timing chart illustrating a disadvantage of the second example.

FIG. 23 is a timing chart illustrating a problem that the second example may have, in which there are depicted behaviors of the comparison signals VCMPX and VCMPY (equivalent to the internal signals SyX and SyY), the charge voltage Vd, the internal signal Sx, and the threshold control signals S170X and S170Y, in order from the top, observed in a case where Tshift=Tmask.

In the example illustrated in the figure, since Tshift=Tmask, after the comparison signal VCMPX rises to high level at time t51, the comparison signal VCMPY rises to high level at time t52, simultaneously with the lapse of the mask period Tmask.

Here, if the above-described discharge operation (see time t42 in FIG. 22) fails to be in time, so that the charge voltage Vd becomes higher than the mask period expiration voltage Vdref and the internal signal Sx rises to high level, the threshold control signals S170X and S170Y simultaneously become high level. As a result, the mask period of the subsequent channel becomes zero, and thus it becomes impossible to secure an instantaneous current. Hereinafter, a third example of the threshold controller 170 will be proposed, which is capable of solving the problem.

Threshold Controller (Third Example)

Figure 24:
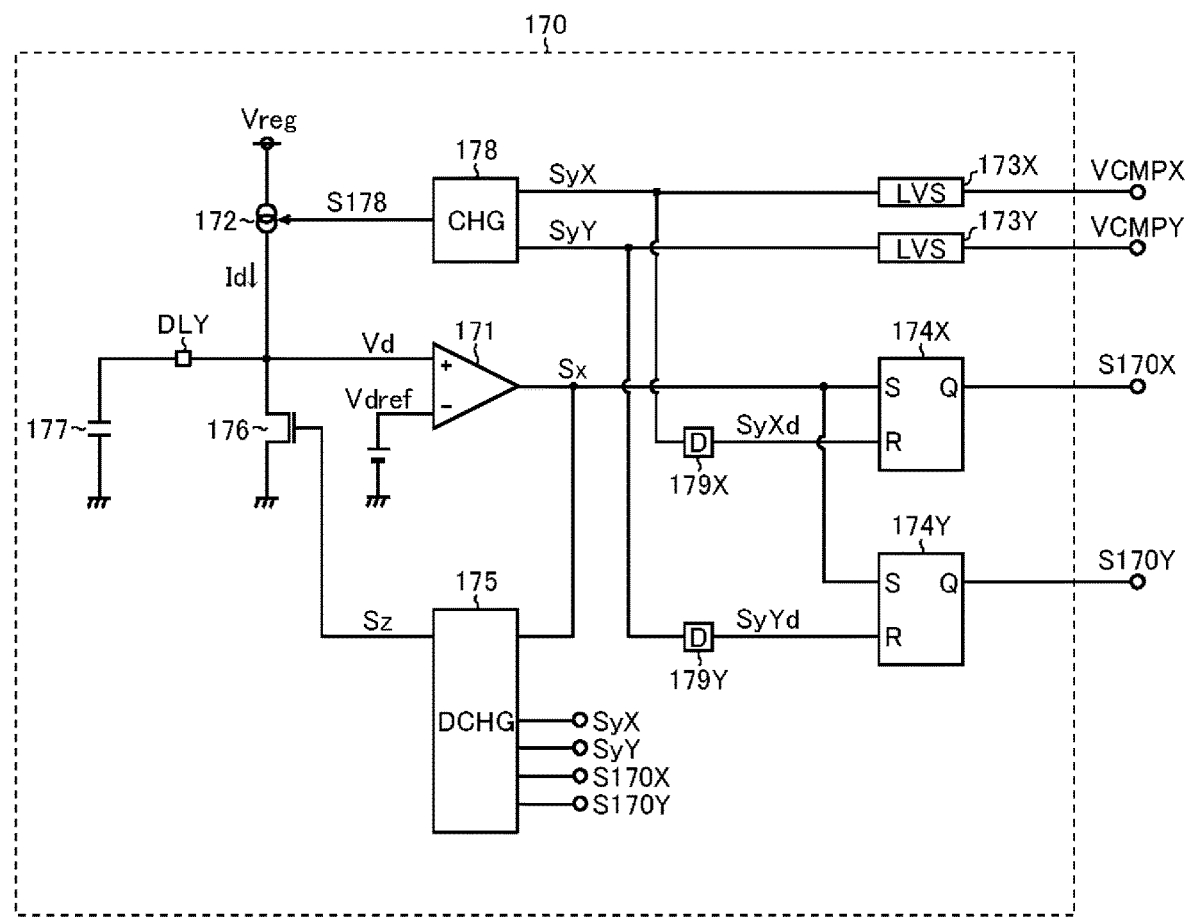
FIG. 24 is a block diagram illustrating a third example of the threshold controller.

FIG. 24 is a block diagram illustrating a third example of the threshold controller 170. The threshold controller 170 of the present example is based on the second example (FIG. 20) described above, and is characterized by being provided with delay sections 179X and 179Y. Hence, the same components as those in the second example will be given the same reference symbols as those in FIG. 20 and thereby overlapping descriptions thereof will be omitted, and the following description will focus on the delay sections 179X and 179Y.

The delay section 179X gives a delay to the internal signal SyX (equivalent to the comparison signal VCMPX), and thereby generates a delay signal SyXd. Here, the delay section 179X gives a delay only to rising timing of the delay signal SyXd, and does not give a delay to falling timing of the delay signal SyXd. More specifically, the delay signal SyXd rises to high level with a delay of delay time td (3 μs, for example) after the internal signal SyX rising to high level, and falls to low level simultaneously with the internal signal SyX falling to low level.

The delay section 179Y gives a delay to the internal signal SyY (equivalent to the comparison signal VCMPY), and thereby generates a delay signal SyYd. Here, the delay section 179Y gives a delay only to rising timing of the delay signal SyYd, and does not give a delay to falling timing of the delay signal SyYd. More specifically, the delay signal SyYd rises to high level with a delay of delay time td after the internal signal SyY rising to high level, and falls to low level simultaneously with the internal signal SyY falling to low level.

As a result of the additional provision of the delay section 179X and 179Y, the delay signals SyXd and SyYd, instead of the internal signals SyX ad SyY, are inputted to the RS flip-flops 174X and 174Y, respectively.

Figure 25:
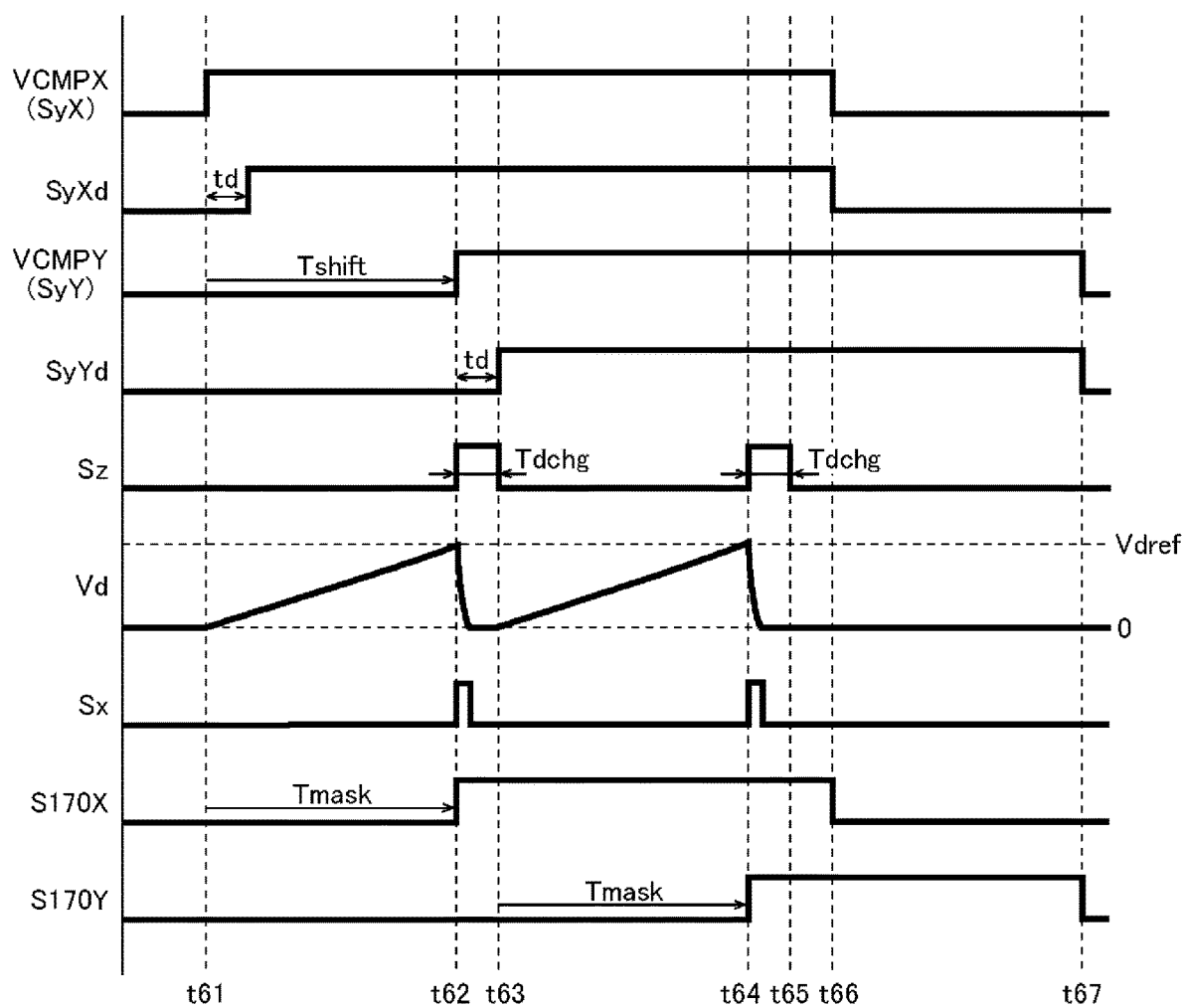
FIG. 25 is a timing chart illustrating a threshold switching operation of the third example.

FIG. 25 is a timing chart illustrating the threshold switching operation of the third example, in which there are depicted behaviors of the comparison signal VCMPX (equivalent to the internal signal SyX), the delay signal SyXd, the comparison signal VCMPY (equivalent to the internal signal SyY), the delay signal SyYd, the internal signal Sz, the charge voltage Vd, the internal signal Sx, and the threshold control signals S170X and S170Y, in order from the top, observed in a case where Tshift=Tmask.

In the example illustrated in the figure, since Tshift=Tmask, after the comparison signal VCMPX (=SyX) rises to high level at time t61, the comparison signal VCMPY (=SyY) rises to high level at time t62, simultaneously with the lapse of the mask period Tmask. On the other hand, the delay signals SyXd and SyYd each have risen to high level at a time point when the predetermined delay time td has elapsed from time t61 and time t62, respectively.

Here, at time t62, when the charge voltage Vd becomes higher than the mask period expiration voltage Vdref, the internal signal Sx becomes high level. At this time, the delay signal SyXd has already risen to high level (=the logic level at a time of reset cancellation). Accordingly, the threshold control signal S170X is set to high level at time t62.

On the other hand, at time t62, the delay signal SyYd is still maintained at low level (=the logic level at a time of reset). Accordingly, even when the internal signal Sx rises to high level, the threshold control signal S170Y is maintained reset to low level.

Further, when the internal signal Sx rises to high level, since the internal signal Sz becomes high level and remains at high level over the predetermined discharge period Tdchg, the charge voltage Vd is discharged to 0 V. Then, when the internal signal Sz falls to low level at time t63, the discharge operation described above is stopped, and the charge voltage Vd starts to rise again.

At time t64, when the charge voltage Vd becomes higher than the mask period expiration voltage Vdref, the internal signal Sx rises to high level again. At this time, the delay signal SyYd has already risen to high level (=the logic level at a time of reset cancellation). Accordingly, the threshold control signal S170Y is set to high level at time t64.

Further, when the internal signal Sx rises to high level, since the internal signal Sz becomes high level and remains at high level over the predetermined discharge period Tdchg, the charge voltage Vd is discharged to 0 V. Then, when the internal signal Sz falls to low level at time t65, the discharge operation described above is stopped. Here, at this time point, since the charge operation has been completed for the two channels, the charge voltage Vd does not start to rise again.

Then, at time t66, when the comparison signal VCMPX (=internal signal SyX) falls to low level, the delay signal SyXd also falls to low level without delay. As a result, the threshold control signal S170X is reset to low level.

Likewise, at time t67, when the comparison signal VCMPY (=the internal signal SyY) falls to low level, the delay signal SyYd also falls to low level without delay. As a result, the threshold control signal S170Y is reset to low level.

In this fashion, in the threshold controller 170 of the present example, the threshold control signals S170X and S170Y are generated by using the internal signal Sx and the delay signals SyXd and SyYd. Thus, when Tshift≤Tmask, the charge voltage Vd never fails to be discharged at rising timing of the comparison signals VCMPX and VCMPY, before the delay signals SyXd and SyYd each rise to high level.

Accordingly, even under a critical condition where Tshift=Tmask, the threshold control signal S170X and S170Y never simultaneously become high level, and thus it is possible to set a correct mask period Tmask for each channel.

<Flowchart>

Figure 26:
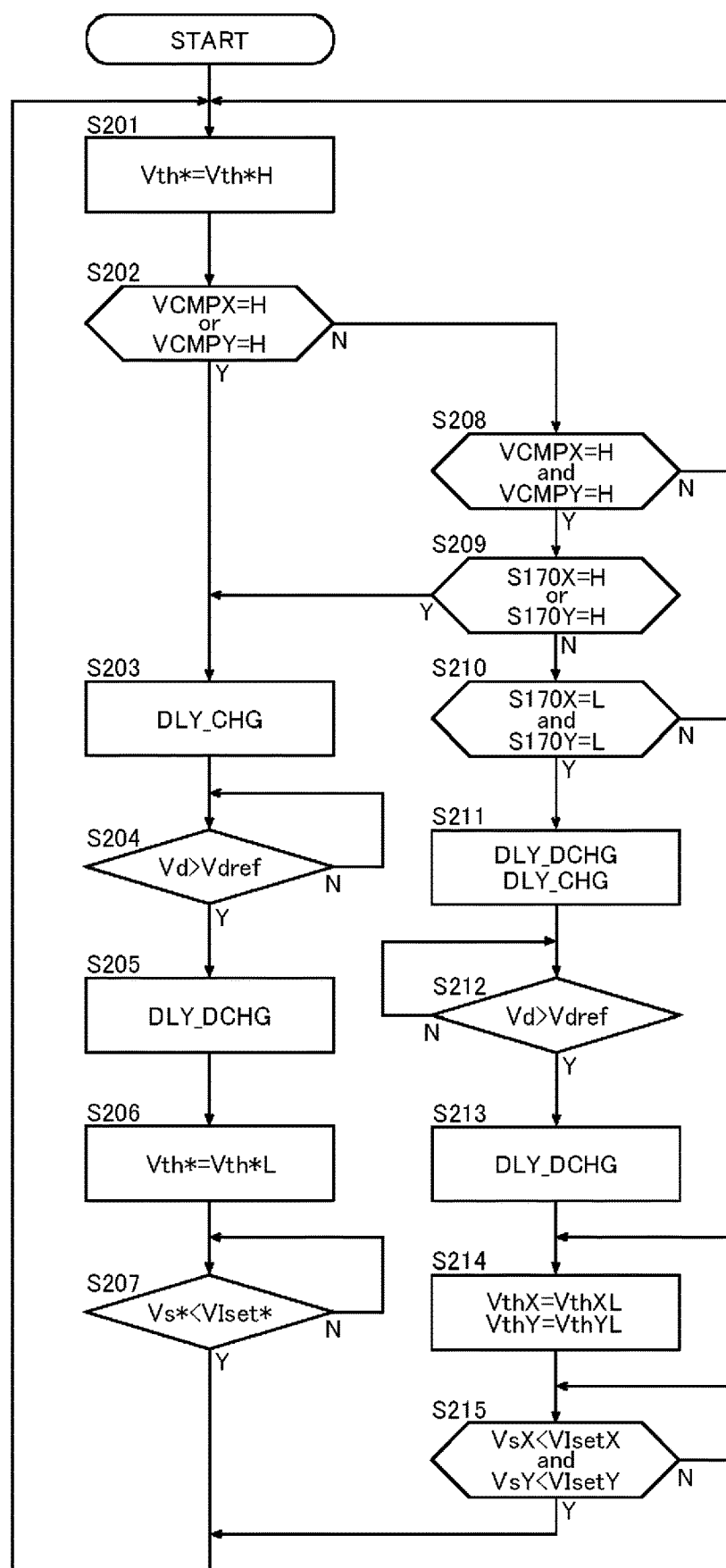
FIG. 26 is a flowchart illustrating an example of a threshold switching operation.

FIG. 26 is a flowchart illustrating an example of a two-channel threshold switching operation. When the flow starts, first, in step S201, the threshold voltage Vth* for a channel that has been started up is set to the internal set value Vth*H (here, "*" is at least either "X" or "Y", this applies also to the following description) (corresponding to time t21 and time t23 in FIG. 18).

Next, in step S202, a determination is made on whether or not one of the comparison signals VCMPX and VCMPY is at high level (that is, whether or not only one channel has been started up). When a Yes-determination is made here, the flow proceeds to step S203 (corresponding to time t22 in FIG. 18). On the other hand, when a No-determination is made, the flow proceeds to step S208.

In step S203, in response to the Yes-determination made in step S202, the capacitor 177 starts to be charged (corresponding to time t22 in FIG. 18).

Next, in step S204, a determination is made on whether or not the charge voltage Vd is higher than the mask period expiration voltage Vdref. When a Yes-determination is made here, the flow proceeds to step S205 (corresponding to time t24 in FIG. 18). On the other hand, when a No-determination is made, the flow returns to step S204, and the determination in this step is repeated (corresponding to from time t22 to time t24 in FIG. 18).

In step S205, in response to the Yes-determination made in step S204, the capacitor 177 is discharged. In step S206, the threshold voltage Vth* for the channel that has been started up is switched to the external set value Vth*L. Steps S205 and S206 correspond to time t24 in FIG. 18.

Next, in step S207, a determination is made on whether or not the sense voltage Vs* for the channel that has been started up is lower than the reference voltage VIset*. When a Yes-determination is made here, the flow returns to step S201, and the threshold voltage Vth* is switched to the internal set value Vth*H again (corresponding to time t26 of FIG. 18). On the other hand, when a No-determination is made, the flow returns to step S207, and the determination in this step is repeated (corresponding to from time t24 to time t26 in FIG. 18).

On the other hand, in step S208, in response to the No-determination made in step S202, a determination is made on whether or not the comparison signals VCMPX and VCMPY are both at high level (that is, whether or not the two channels have both been started up). When a Yes-determination is made here, the flow proceeds to step S209 (corresponding to time t23 in FIG. 18, time t42 in FIG. 22, or time t62 in FIG. 25). On the other hand, when a No-determination is made, neither of the channels has been started up, and thus the flow returns to step S201.

In step S209, in response to the Yes-determination made in step S208, a determination is made on whether or not one of the threshold signals S170X and S170Y is at high level (that is, whether or not the threshold voltage Vth* for the preceding channel has already been switched to the external set value Vth*L). When a Yes-determination is made here, the flow proceeds to step S203, and in steps S203 to S207, the threshold switching operation for the subsequent channel is performed (corresponding to from time t25 to time t28 in FIG. 18). On the other hand, when a No-determination is made, the flow proceeds to step S210.

In step S210, in response to the No-determination made in step S209, a determination is made on whether or not the threshold signals S170X and S170Y are both at low level (that is, whether or not the startup timing of the subsequent channel has come before a lapse of the mask period Tmask of the preceding channel. When a Yes-determination is made here, the flow proceeds to step S211 (corresponding to time t42 in FIG. 22). On the other hand, when a No-determination is made, the flow proceeds to step S214.

In step S211, in response to the Yes-determination made in step S210, the capacitor 177 is discharged, and then starts to be charged again (corresponding to from time t42 to time t43 in FIG. 22).

Next, in step S212, a determination is made on whether or not the charge voltage Vd is higher than the mask period expiration voltage Vdref. When a Yes-determination is made here, the flow proceeds to step S213 (corresponding to time t44 in FIG. 22). On the other hand, when a No-determination is made, the flow returns to step S212, and the determination in this step is repeated (corresponding to from time t43 to time t44 in FIG. 22).

In step S213, in response to the Yes-determination made in step S212, the capacitor 177 is discharged. In step S214, the threshold voltages VthX and VthYL for the two channels are switched to the external set values VthXL and VthYL. Steps S205 and S206 correspond to time t44 in FIG. 22.

Next, in step S215, a determination is made on whether or not the sense voltages VsX and VsY for the two channels are lower than the reference voltages VIsetX and VIsetY. When a Yes-determination is made here, the flow returns to step S201, into a state of waiting for a next startup. On the other hand, when a No-determination is made, the flow returns to step S215, and the determination in this step is repeated.

<Multiplexer>

Figure 27:
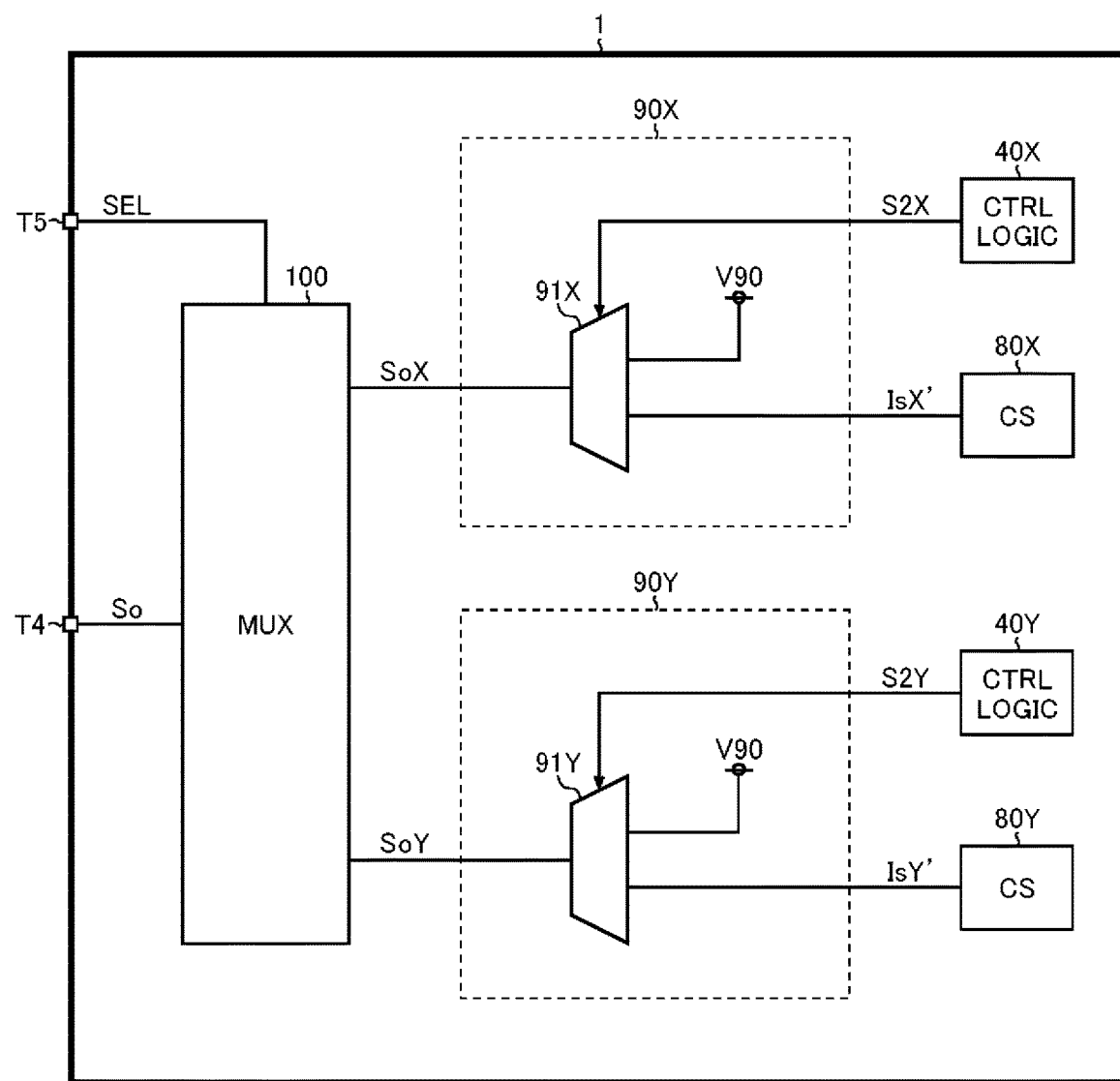
FIG. 27 is a block diagram illustrating an example where a multiplexer is introduced.

FIG. 27 is a block diagram illustrating an example in which a multiplexer is introduced as an output stage of the status notification signal So along with the two-channelization of the semiconductor integrated circuit device 1, which has been described so far. In the semiconductor integrated circuit device 1 of this configuration example, output current detectors 80X and 80Y, signal output sections 90X and 90Y, a multiplexer 100, and an external terminal T5 are integrated.

The output current detector 80X generates a sense current IsX' in accordance with an output current IoX, and outputs the resulting sense current IsX' to the signal output section 90X.

The output current detector 80Y generates a sense current IsY' in accordance with an output current IoY, and outputs the resulting sense current IsY' to the signal output section 90Y.

The signal output section 90X includes a selector 91X which, based on an output selection signal S2X inputted from a control logic section 40X, selectively outputs one of the sense current IsX' (=corresponding to a result of detection of the output current IoX) and a fixed voltage V90 (=corresponding to an abnormality flag) as a first status notification signal SoX. Here, the selector 91X selectively outputs the sense current IsX' as the first status notification signal SoX when the output selection signal S2X is at a logic level (for example, low level) of when no abnormality has been detected, and outputs the fixed voltage V90 as the first status notification signal SoX when the output selection signal S2X is at a logic level (for example, high level) of when an abnormality has been detected.

The signal output section 90Y includes a selector 91Y which selectively outputs one of the sense current IsY' (=corresponding to a result of detection of the output current IoY) and a fixed voltage V90 (=corresponding to an abnormality flag) as a second status notification signal SoY, based on an output selection signal S2Y inputted from a control logic section 40Y. Here, the selector 91Y selectively outputs the sense current IsY' as the second status notification signal SoY when the output selection signal S2Y is at a logic level (for example, low level) of when no abnormality is detected, and outputs the fixed voltage V90 as the second status notification signal SoY when the output selection signal S2Y is at a logic level (for example, high level) of when an abnormality is detected.

In accordance with an output selection signal SEL inputted to the external terminal T5, the multiplexer 100 selectively outputs one of the first status notification signal SoX (=the sense current IsX' or the fixed voltage V90) and a second status notification signal SoY (=the sense current IsY' or the fixed voltage V90) to the external terminal T4.

In a case where the sense current IsX' is selectively outputted to the external terminal T4, an output detection voltage V80X (=IsX'×R4) obtained by current-voltage conversion of the sense current IsX' by the external sense resistor 4 is transmitted as the status notification signal So to the ECU 2. Here, the larger the output current IoX is, the higher the output detection voltage V80X becomes, and the smaller the output current IoX is, the lower the output detection voltage V80X becomes.

In a case where the sense current IsY' is selectively outputted to the external terminal T4, an output detection voltage V80Y (=IsY'×R4) obtained by current/voltage conversion of the sense current IsY' by the external sense resistor 4 is transmitted as the status notification signal So to the ECU 2. Here, the larger the output current IoY is, the higher the output detection voltage V80Y becomes, and the smaller the output current IoY is, the lower the output detection voltage V80Y becomes.

On the other hand, in a case where the fixed voltage V90 is selectively outputted to the external terminal T4, the fixed voltage V90 is transmitted as the status notification signal So to the ECU 2. Here, the fixed voltage V90 may be set to a voltage value higher than the upper limit values of the output detection voltages V80X and V80Y.

With the introduction of the multiplexer 100 operating as described above, it is possible to externally monitor both the detection results of the output currents IoX and IoY and the abnormality flag for an arbitrary channel.

<Application to Vehicle>

Figure 28:
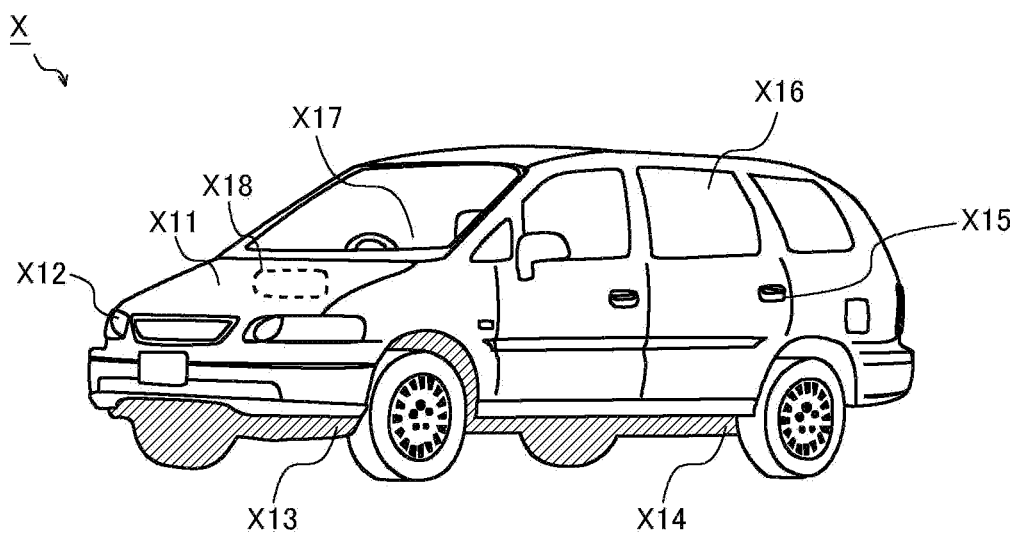
FIG. 28 is an external view of a vehicle, illustrating an example of a configuration of the vehicle.

FIG. 28 is an external view of a vehicle, illustrating an example of a configuration of the vehicle. A vehicle X of the present configuration example has mounted therein a battery (not shown in the figure) and several electronic apparatuses X11 to X18 which operate with power supplied from the battery. Here, for convenience of illustration, mounting positions of the electronic apparatuses X11 to X18 in this figure may be different from actual positions.

The electronic apparatus X11 is an engine control unit which performs engine-related control (injection control, electronic throttle control, idling control, oxygen sensor heater control, auto cruise control, etc.).

The electronic apparatus X12 is a lamp control unit which performs ON/OFF control of an HID (high intensity discharged lamp) or a DRL (daytime running lamp).

The electronic apparatus X13 is a transmission control unit which performs transmission-related control.

The electronic apparatus X14 is a body control unit which performs control related to motion of the vehicle X (ABS (anti-lock brake system) control, EPS (electric power steering) control, electronic suspension control, etc.).

The electronic apparatus X15 is a security control unit that performs control of driving of a door lock, a security alarm, etc.

The electronic apparatus X16 is an electronic apparatus incorporated in the vehicle X at the factory shipping stage as standard equipment or a factory-installed option, such as a wiper, an electric door mirror, a power window, a damper (a shock absorber), an electric sunroof, an electric seat, etc.

The electronic apparatus X17 is an electronic apparatus that is optionally mounted on the vehicle X as a user option such as an in-vehicle A/V (audio/visual) device, a car navigation system, an ETC (electronic toll collection system), etc.

The electronic apparatus X18 is an electronic apparatus, such as an in-vehicle blower, an oil pump, a water pump, a battery cooling fan, etc., which each include a high-withstanding-voltage motor.

Note that the semiconductor integrated circuit device 1, the ECU 2, and the load 3 described above can be incorporated in any of the electronic apparatuses X11 to X18.

OTHER MODIFIED EXAMPLES

In the above embodiments, the descriptions have been given by taking an in-vehicle high-side switch IC as an example, but application targets of the invention disclosed herein are not limited thereto; for example, the present invention disclosed herein is widely applicable not only to other in-vehicle IPDs (in-vehicle low-side switch ICs, in-vehicle power supply ICs, etc.) but also to semiconductor integrated circuit devices for use other than in vehicles.

Furthermore, in addition to the above embodiments, it is possible to add various modifications to the various technical features disclosed herein without departing from the spirit of the technological creation. In other words, it should be understood that the above embodiments are examples in all respects and are not limiting; the technological scope of the present invention is not indicated by the above description of the embodiments but by the claims; and all modifications within the scope of the claims and the meaning equivalent to the claims are covered.

INDUSTRIAL APPLICABILITY

The invention disclosed herein is applicable to in-vehicle IPDs, for example.

LIST OF REFERENCE SIGNS 1 semiconductor integrated circuit device
2 ECU
3, 3X, 3Y load
4 external sense resistor
10, 10X, 10Y NMOSFET
20, 20X, 20Y output current monitor
21, 21' NMOSFET
22 sense resistor
30, 30X, 30Y gate controller
31 gate driver
32 oscillator
33 charge pump
34 clamper
35 NMOSFET
40, 40X, 40Y control logic section
50, 50X, 50Y signal input section
60, 60X, 60Y internal power supply
70, 70X, 70Y abnormality protection section
71, 71X, 71Y overcurrent protection circuit
72 open protection circuit
73 temperature protection circuit
74 voltage reduction protection circuit
80, 80X, 80Y output current detector
90, 90X, 90Y signal output section
91, 91X, 91Y selector
100 multiplexer 110 first current generator
111 operational amplifier
112 NMOSFET
113 resistor
120 second current generator
121 operational amplifier
122 NMOSFET
123 resistor
130, 130X, 130Y threshold voltage generator
131 current source
132 resistor
133 current mirror
140, 140X, 140Y overcurrent detector
141 comparator
150, 150X, 150Y reference voltage generator
151 current source
152 resistor
160, 160X, 160Y comparison section
161 comparator
170 threshold controller
171 comparator
172 current source
173, 173X, 173Y level shifter
174, 174X, 174Y RS flip-flop
175 discharge controller
176 NMOSFET
177 capacitor
178 charge controller
179X, 179Y delay section
NOR1 NOR operation unit
AND1 to AND3 AND operation unit
OR1 OR operation unit
INV1 to NV3 inverter
PG1 pulse generator
R1 resistor
C1 capacitor
T1 to T5, SET, DLY external terminal
X vehicle
X11 to X18 electronic apparatus

The invention claimed is:

1. An overcurrent protection circuit comprising:
an overcurrent detector configured to compare a sense signal in accordance with a monitored current with a variable overcurrent detection threshold and generate an overcurrent protection signal; and
a comparison section configured to compare the sense signal with a reference value in accordance with the variable overcurrent detection threshold and generate a comparison signal, wherein
the monitored current is an output current flowing through a high-side switch.

2. An overcurrent protection circuit comprising:
an overcurrent detector configured to compare a sense signal in accordance with a monitored current with a variable overcurrent detection threshold and generate an overcurrent protection signal; and
a comparison section configured to compare the sense signal with a reference value in accordance with the variable overcurrent detection threshold and generate a comparison signal,
wherein:
the monitored current includes a first monitored current and a second monitored current,
the sense signal includes a first sense signal and a second sense signal,
the variable overcurrent detection threshold includes a first variable overcurrent detection threshold and a second variable overcurrent detection threshold,
the overcurrent protection signal includes a first overcurrent protection signal and a second overcurrent protection signal,
the reference value includes a first reference value and a second reference value,
the comparison signal includes a first comparison signal and a second comparison signal,
the overcurrent detector includes a first overcurrent detector and a second overcurrent detector, and
the comparison section includes a first comparison section and a second comparison section, wherein
the first monitored current is a first output current flowing through a first high-side switch, and
the second monitored current is a second output current flowing through a second high-side switch.

3. The overcurrent protection circuit according to claim 2, further comprising:
a first threshold generator configured to switch, in accordance with a first threshold control signal, whether the first overcurrent detection threshold should be a first set value or a second set value which is lower than the first set value;
a second threshold generator configured to switch, in accordance with a second threshold control signal, whether the second overcurrent detection threshold should be a third set value or a fourth set value which is lower than the third set value;
a first reference value generator configured to generate the first reference value in accordance with the second set value;
a second reference value generator configured to generate the second reference value in accordance with the fourth set value; and
a threshold controller configured to monitor both the first comparison signal and the second comparison signal and to generate the first threshold control signal and the second threshold control signal, wherein:
the first over current protection detector is configured to compare the first sense signal in accordance with the first monitored current with the first overcurrent detection threshold and to generate the first overcurrent protection signal,
the second overcurrent detector is configured to compare the second sense signal in accordance with the second monitored current with the second overcurrent detection threshold and to generate the second overcurrent protection signal,
the first comparison section is configured to compare the first sense signal with the first reference value and to generate the first comparison signal, and
the second comparison section is configured to compare the second sense signal with the second reference value and to generate the second comparison signal.

4. The overcurrent protection circuit according to claim 3, wherein the threshold controller includes:
an external terminal for externally connecting a capacitor,
a comparator configured to compare a charge voltage which appears at the external terminal with a predetermined reference voltage and to generate an internal signal,
a first flip-flop configured to generate the first threshold control signal in accordance with the internal signal and the first comparison signal, a second flip-flop configured to generate the second threshold control signal in accordance with the internal signal and the second comparison signal, a discharge controller configured to perform discharge control of the capacitor in accordance with the internal signal, and a charge controller configured to perform charge control of the capacitor in accordance with both the first comparison signal and the second comparison signal.

5. The overcurrent protection circuit according to claim 4, wherein the overcurrent protection circuit is configured such that:

the discharge controller accepts input of not only the internal signal but also the first comparison signal, the second comparison signal, the first threshold control signal, and the second threshold control signal, and when, after a logic-level change occurs in one of the first comparison signal and the second comparison signal and a charging operation of the capacitor is started, a logic-level change occurs in another of the first comparison signal and the second comparison signal before the charge voltage becomes higher than the reference voltage, the capacitor is discharged.

6. The overcurrent protection circuit according to claim 5, wherein the threshold controller further includes:

a first delay section configured to give a delay to the first comparison signal and to generate a first delay signal, and a second delay section configured to give a delay to the second comparison signal and to generate a second delay signal, and the first delay signal and the second delay signal, instead of the first comparison signal and the second comparison signal, are inputted to the first flip-flop and the second flip-flop, respectively.

7. The overcurrent protection circuit according to claim 3, wherein each of the first set value and the third set value is a fixed value, and each of the second set value and the fourth set value is a variable value.

8. A semiconductor integrated circuit device comprising, integrated therein:

a first high-side switch configured to switch a first current path, through which a first output current flows, between a conducting state and a cutoff state;

a second high-side switch configured to switch a second current path, through which a second output current flows, between a conducting state and a cutoff state;

a first output current monitor configured to generate a first sense signal in accordance with the first output current;

a second output current monitor configured to generate a second sense signal in accordance with the second output current;

a first gate controller configured to generate a first driving signal for the first high-side switch in accordance with a first control signal;

a second gate controller configured to generate a second driving signal for the second high-side switch in accordance with a second control signal; and the overcurrent protection circuit according to claim 3 configured to monitor the first sense signal and the second sense signal and to generate a first overcurrent protection signal and a second overcurrent protection signal, wherein the first gate controller and the second gate controller have functions of forcibly turning off the first high-side switch and the second high-side switch in accordance with the first overcurrent protection signal and the second overcurrent protection signal, respectively.

9. The semiconductor integrated circuit device according to claim 8, further comprising, integrated therein:

a first signal output section configured to generate one of a detection result of the first output current and an abnormality flag as a first status notification signal;

a second signal output section configured to generate one of a detection result of the second output current and an abnormality flag as a second status notification signal; and a multiplexer configured to selectively output one of the first status notification signal and the second status notification signal to outside the device.

10. An electronic apparatus comprising:

the semiconductor integrated circuit device according to claim 8;

a first load connected to the first high-side switch; and a second load connected to the second high-side switch.

11. The electronic apparatus according to claim 10, wherein each of the first load and the second load is a bulb lamp, a relay coil, a solenoid, a light emitting diode, or a motor.

12. A vehicle comprising the electronic apparatus according to claim 10.

* * * * *